(12) United States Patent
Xie et al.

(10) Patent No.: US 11,800,698 B2
(45) Date of Patent: Oct. 24, 2023

(54) SEMICONDUCTOR STRUCTURE WITH EMBEDDED CAPACITOR

(71) Applicant: International Business Machines Corporation, Armonk, NY (US)

(72) Inventors: Ruilong Xie, Niskayuna, NY (US); Takashi Ando, Eastchester, NY (US); Alexander Reznicek, Troy, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 17/403,992

(22) Filed: Aug. 17, 2021

(65) Prior Publication Data
US 2023/0055047 A1 Feb. 23, 2023

(51) Int. Cl.
*H10B 12/00* (2023.01)
*H01L 29/423* (2006.01)
*H01L 29/06* (2006.01)

(52) U.S. Cl.
CPC ......... *H10B 12/00* (2023.02); *H01L 29/0665* (2013.01); *H01L 29/42392* (2013.01); *H10B 12/01* (2023.02)

(58) Field of Classification Search
CPC ..... H10B 12/00; H10B 12/01; H01L 29/0665; H01L 29/42392
See application file for complete search history.

(56) References Cited

U.S. PATENT DOCUMENTS

| | | |
|---|---|---|
| 6,326,275 B1 | 12/2001 | Harrington et al. |
| 9,685,499 B1 | 6/2017 | Bi et al. |
| 9,985,097 B2 | 5/2018 | Cheng et al. |
| (Continued) | | |

FOREIGN PATENT DOCUMENTS

| | | | |
|---|---|---|---|
| CN | 114765218 A * | 7/2022 | ........... H01L 27/092 |
| WO | 2019053549 A1 | 3/2019 | |
| WO | 2021014258 A1 | 1/2021 | |

OTHER PUBLICATIONS

S. Ambrogio et al., "Equivalent-Accuracy Accelerated Neural-Network Training Using Analogue Memory," Nature, vol. 558, Jun. 7, 2018, 23 pages.

(Continued)

*Primary Examiner* — Edward Chin
(74) *Attorney, Agent, or Firm* — Samuel Waldbaum; Ryan, Mason & Lewis, LLP

(57) ABSTRACT

Techniques for fabricating semiconductor structures and devices with stacked structures having embedded capacitors are disclosed. In one example, a semiconductor structure includes a substrate having a first region and a second region. The semiconductor structure further includes a capacitor structure disposed in the second region of the substrate. The capacitor structure includes a capacitor conductor and a dielectric insulator disposed between the capacitor conductor and the substrate. The semiconductor structure further includes a stacked device disposed on the first region of the substrate. The stacked device includes a first transistor and a second transistor. At least a portion of the second transistor is disposed under at least a portion of the first transistor. The first transistor and the second transistor are each coupled to the capacitor conductor.

18 Claims, 27 Drawing Sheets

(56) References Cited

U.S. PATENT DOCUMENTS

| | | | |
|---|---|---|---|
| 10,127,494 B1 | 11/2018 | Cantin et al. | |
| 10,157,935 B2* | 12/2018 | Cheng | H01L 29/0665 |
| 10,256,231 B2 | 4/2019 | Cheng et al. | |
| 10,269,425 B2 | 4/2019 | Gokmen et al. | |
| 10,283,516 B1 | 5/2019 | Reznicek et al. | |
| 10,541,242 B2 | 1/2020 | Reznicek | |
| 10,833,146 B2 | 11/2020 | Xu et al. | |
| 11,069,684 B1 | 7/2021 | Xie et al. | |
| 11,500,614 B2* | 11/2022 | Hekmatshoartabari | H01L 21/823807 |
| 2016/0343452 A1 | 11/2016 | Ikeda et al. | |
| 2018/0083046 A1 | 3/2018 | Cheng et al. | |
| 2019/0080230 A1 | 3/2019 | Hatcher et al. | |
| 2019/0138893 A1 | 5/2019 | Sharma et al. | |
| 2019/0181338 A1 | 6/2019 | Hashemi et al. | |
| 2019/0221277 A1 | 7/2019 | Reznicek et al. | |
| 2020/0020695 A1 | 1/2020 | Leobandung | |
| 2020/0227418 A1* | 7/2020 | Kim | H10B 12/373 |
| 2021/0265345 A1 | 8/2021 | Xie et al. | |
| 2021/0349691 A1* | 11/2021 | Hekmatshoartabari | H01L 29/42392 |
| 2021/0375858 A1* | 12/2021 | Chiang | H01L 21/76224 |
| 2022/0013523 A1* | 1/2022 | Cheng | H01L 29/66181 |
| 2022/0223594 A1* | 7/2022 | Lee | H01L 29/7851 |
| 2022/0231020 A1* | 7/2022 | Frougier | H01L 29/42392 |
| 2022/0262683 A1* | 8/2022 | Chu | H01L 29/78696 |
| 2022/0321794 A1 | 10/2022 | Yoneda et al. | |
| 2023/0108707 A1* | 4/2023 | Gardner | H01L 29/42392 257/401 |

OTHER PUBLICATIONS

List of IBM Patents or Patent Applications Treated as Related.

B. D. Hoskins et al., "Streaming Batch Eigenupdates for Hardware Neural Networks," Frontiers in Neuroscience, Aug. 6, 2019, 9 pages, vol. 13, No. 793.

Y. Li et al., "Capacitor-based Cross-point Array for Analog Neural Network with Record Symmetry and Linearity," 2018 Symposium on VLSI Technology Digest of Technical Papers, Jun. 2018, pp. 25-26.

N. Wang et al., "Training Deep Neural Networks with 8-bit Floating Point Numbers," 32nd Conference on Neural Information Processing Systems, Dec. 2018, 10 pages.

Wikipedia, "Transistor Count," https://en.wikipedia.org/wiki/Transistor_count, May 11, 2020, 36 pages.

International Search Report and Written Opinion of PCT/CN2022/099146, dated Sep. 16, 2022, 9 pages.

* cited by examiner

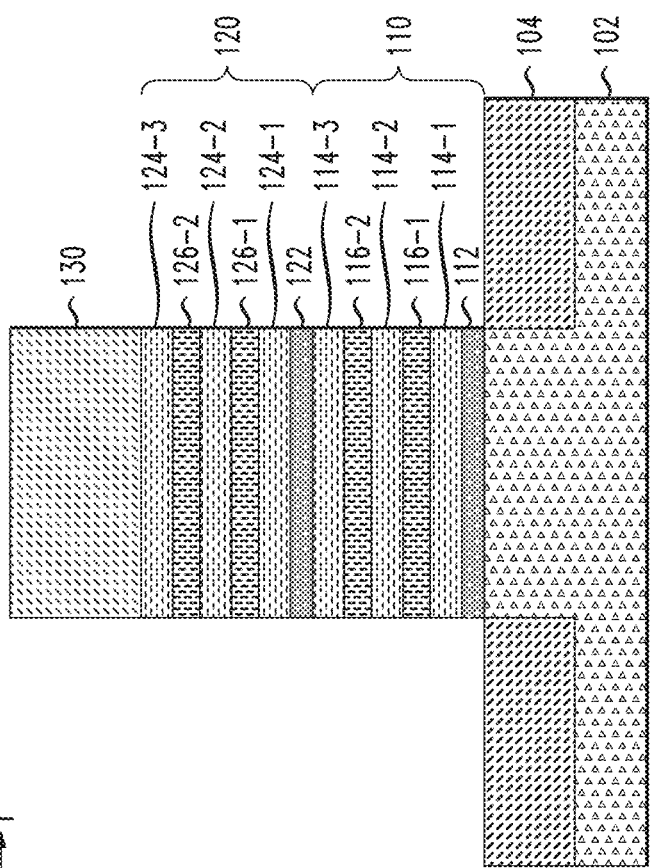
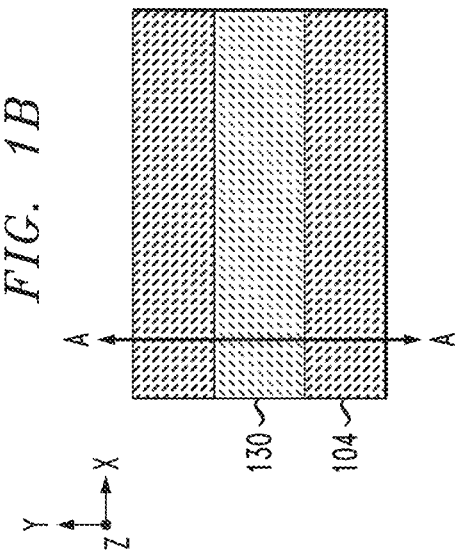

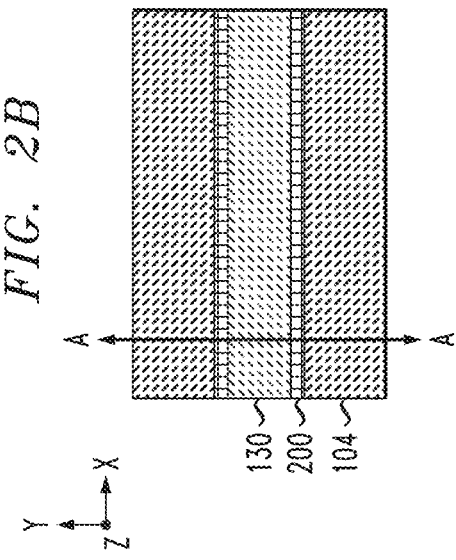
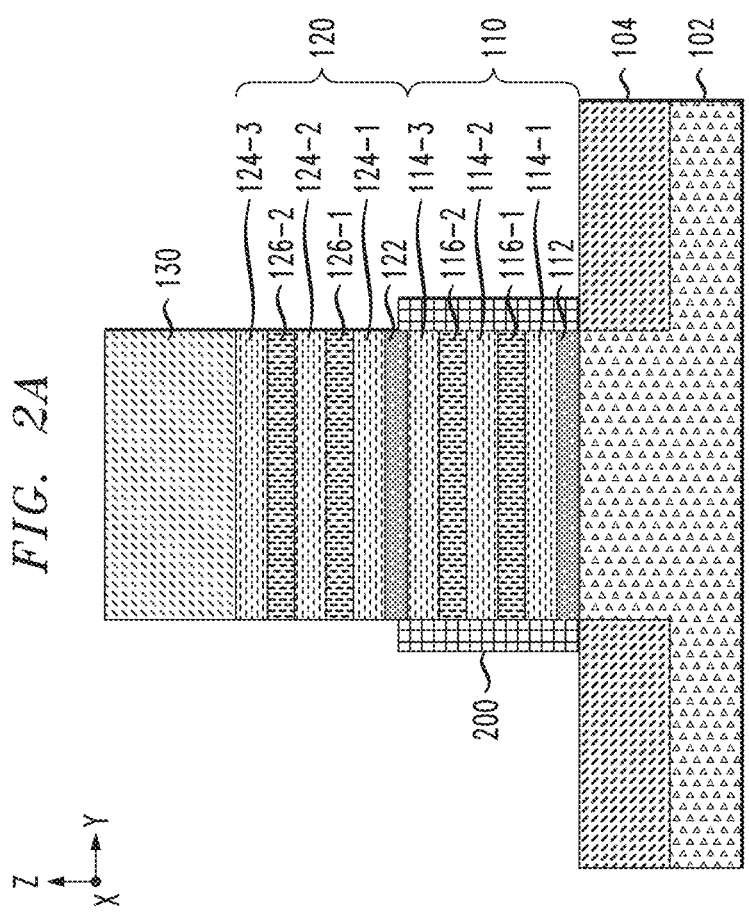

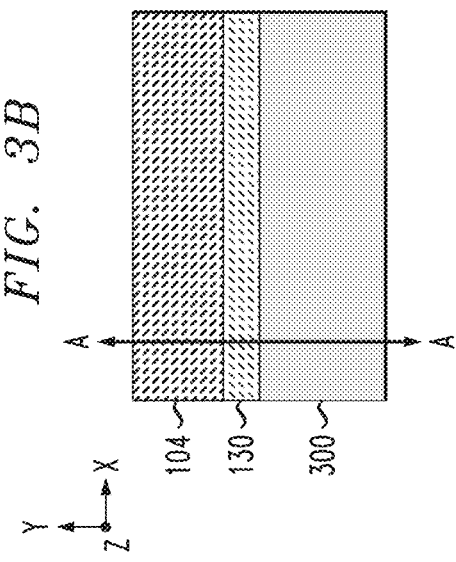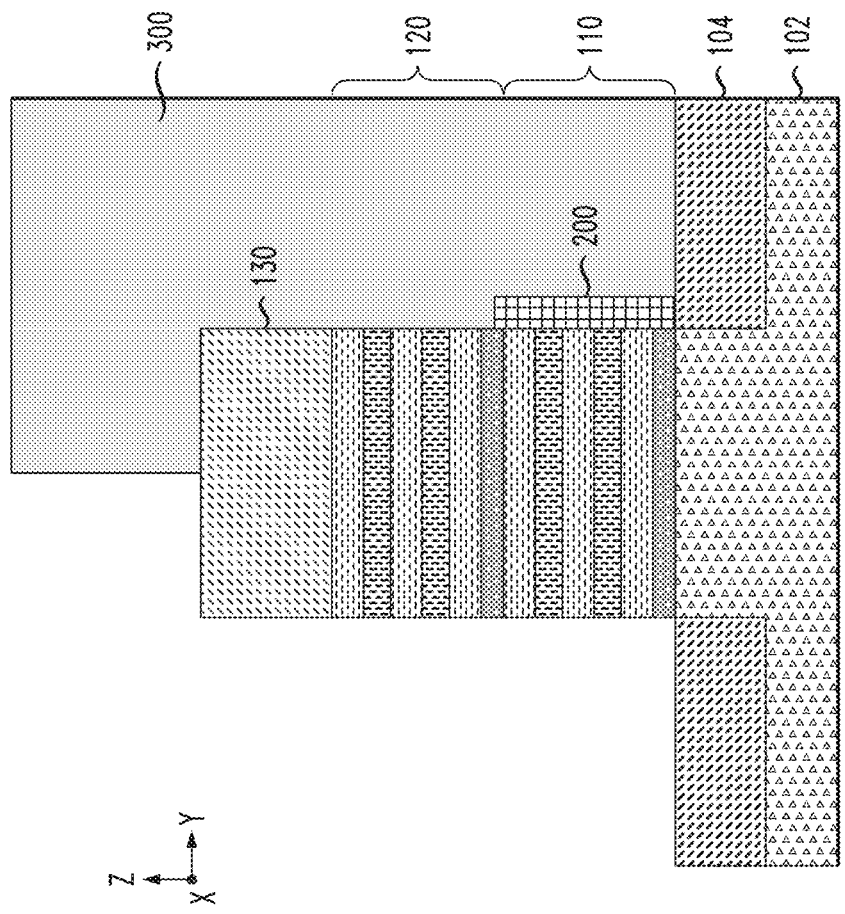

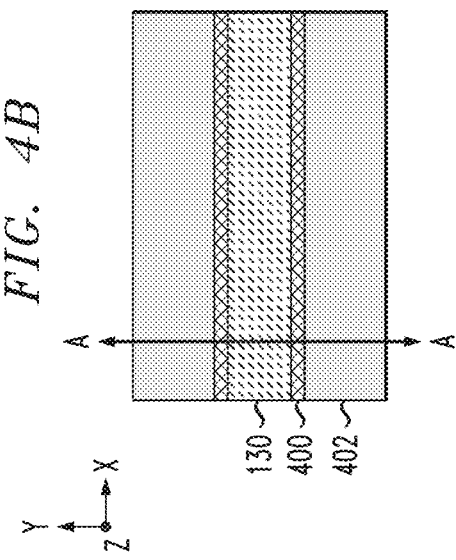
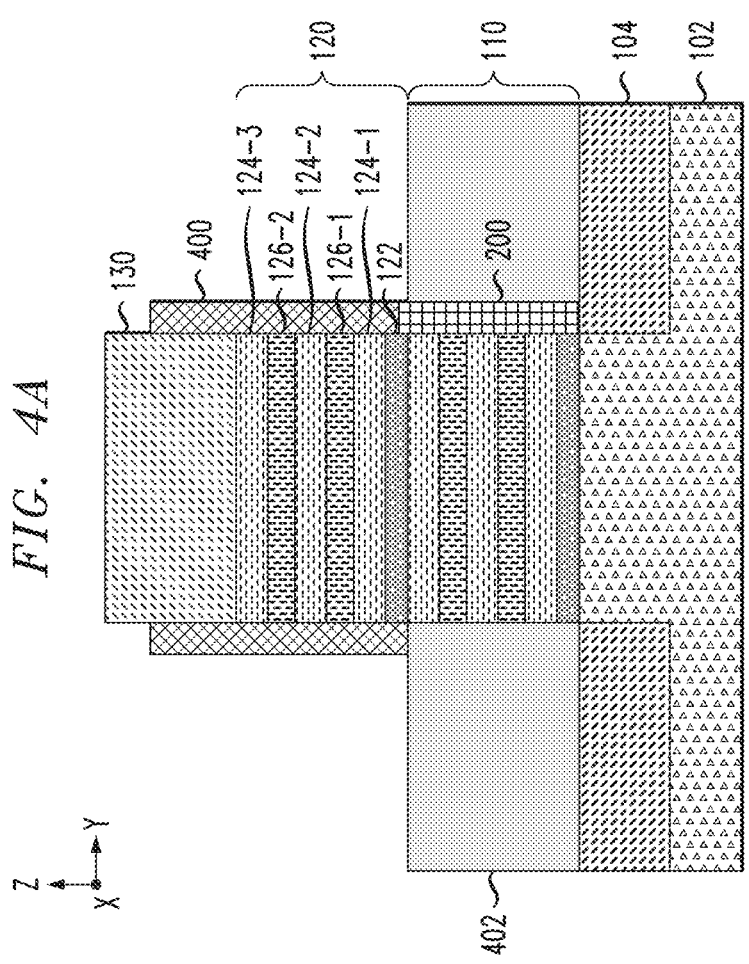
FIG. 4B
FIG. 4A

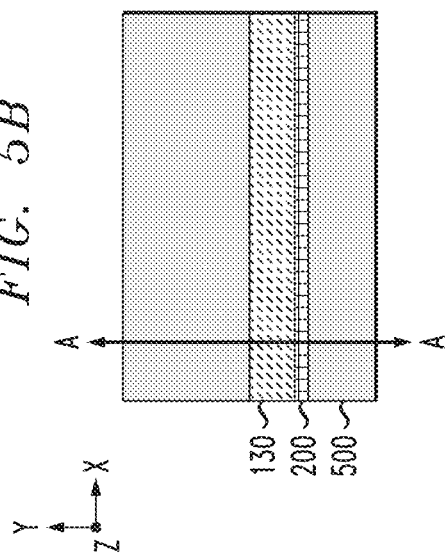
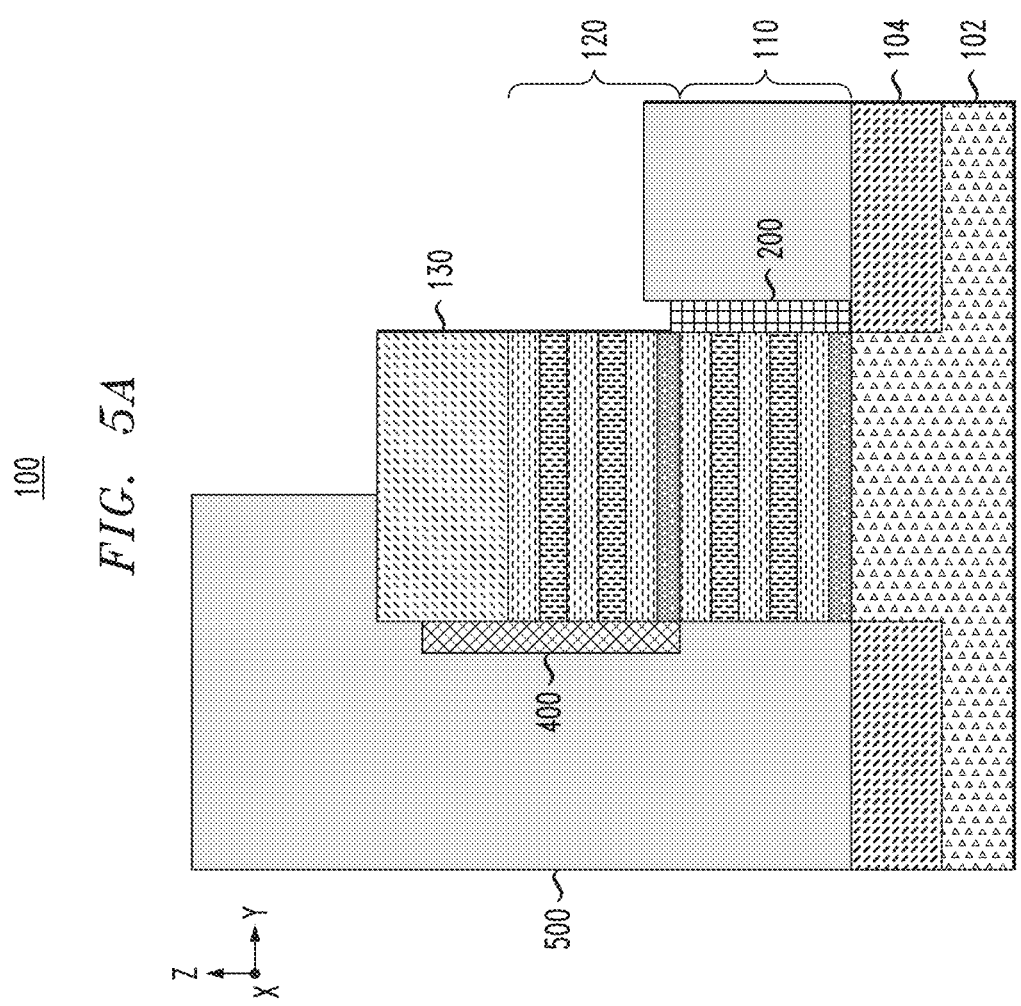

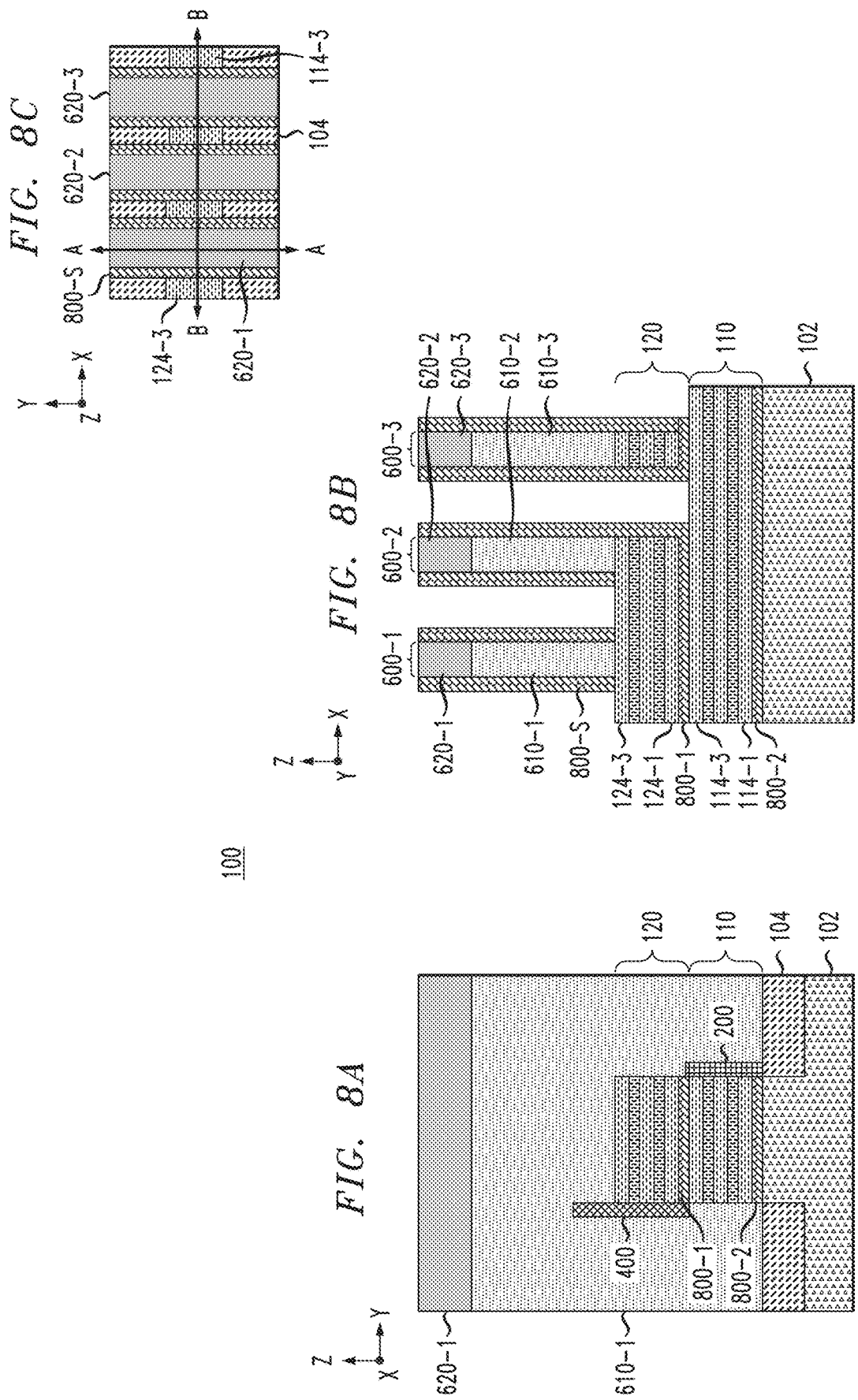

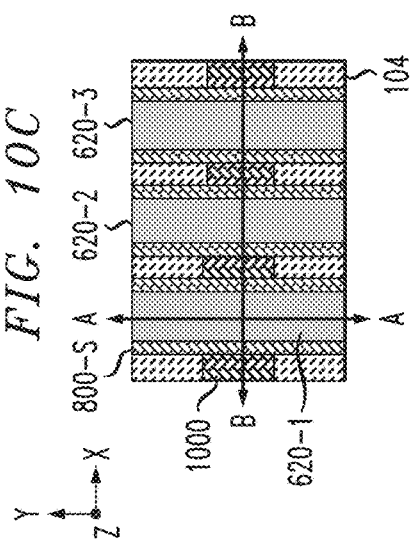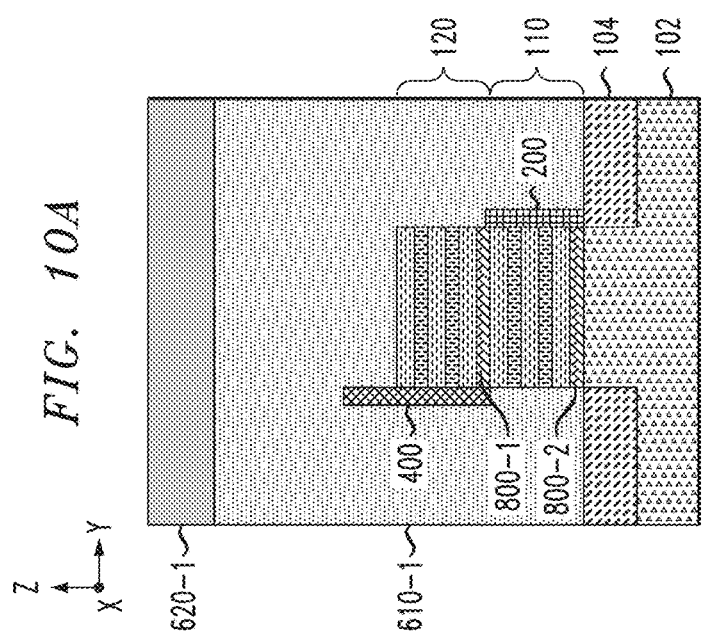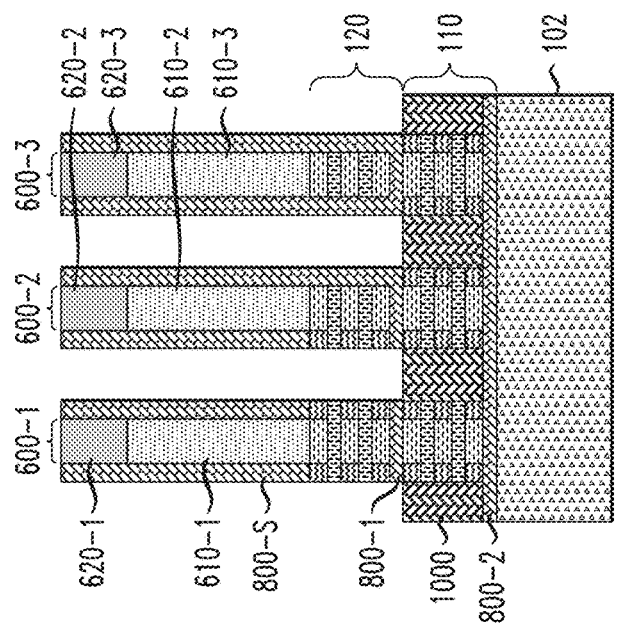

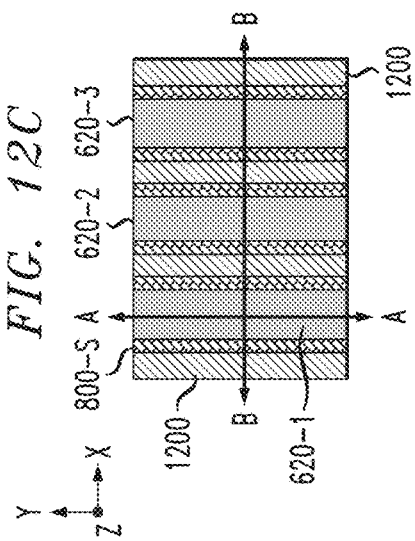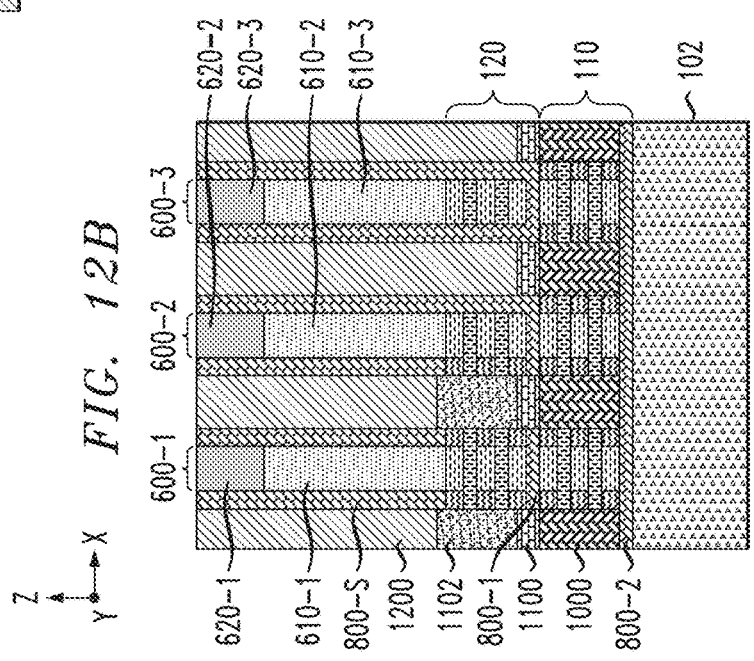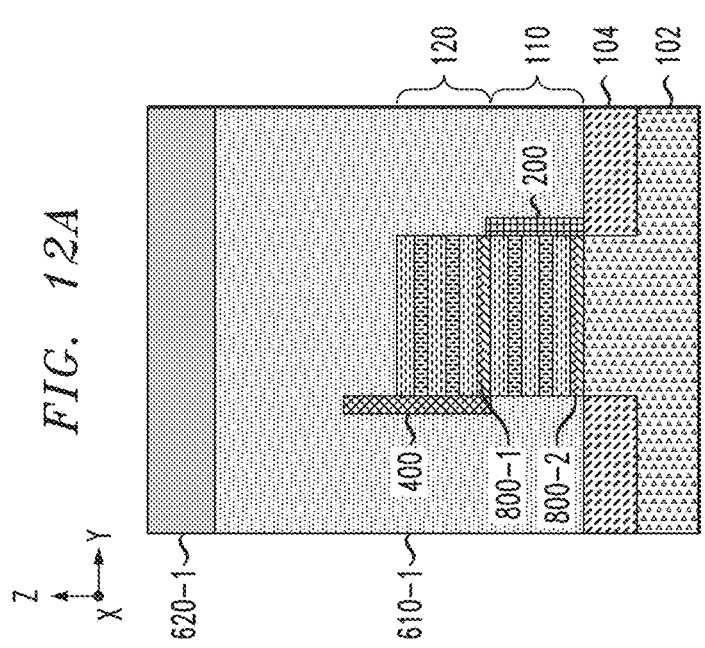

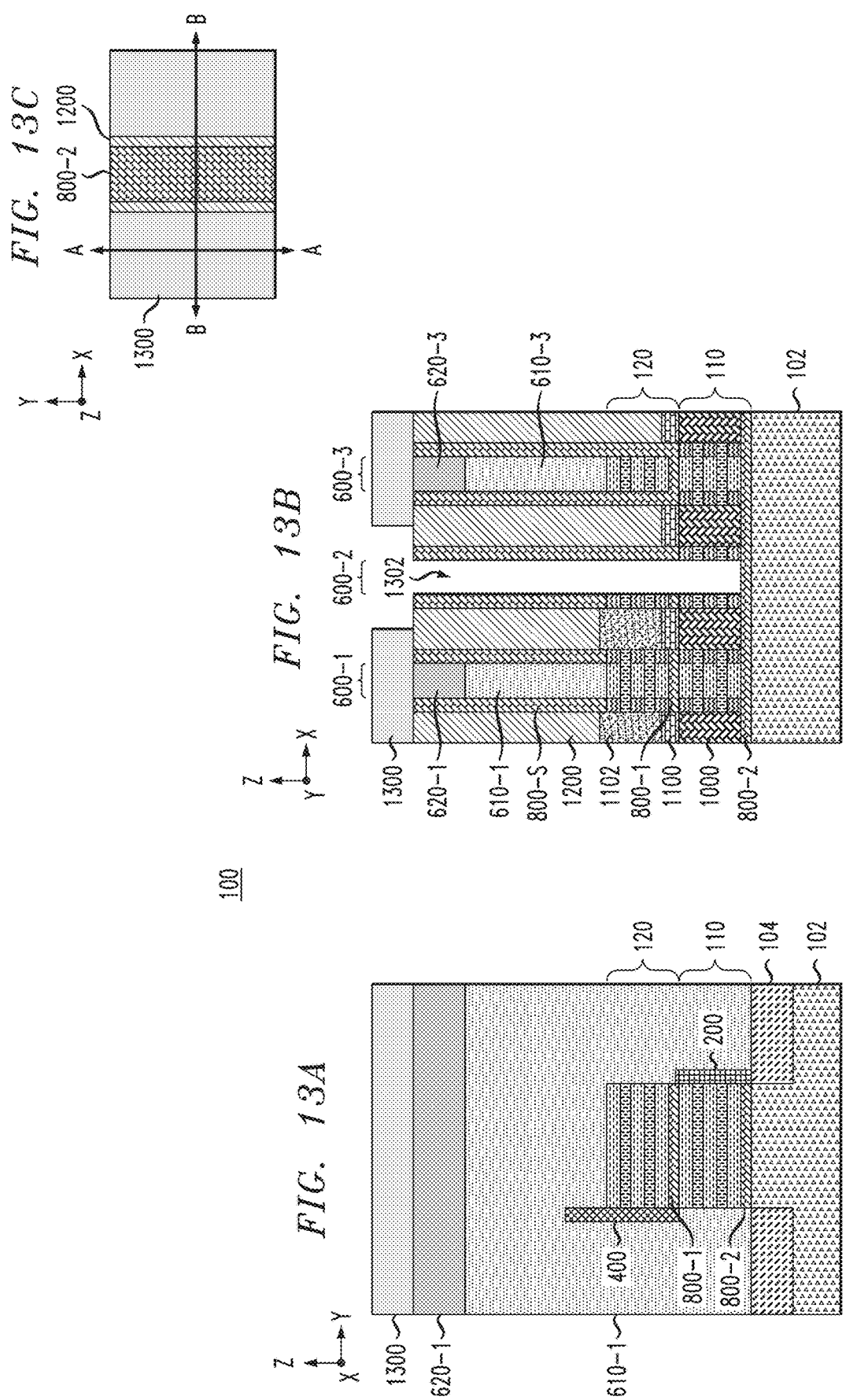

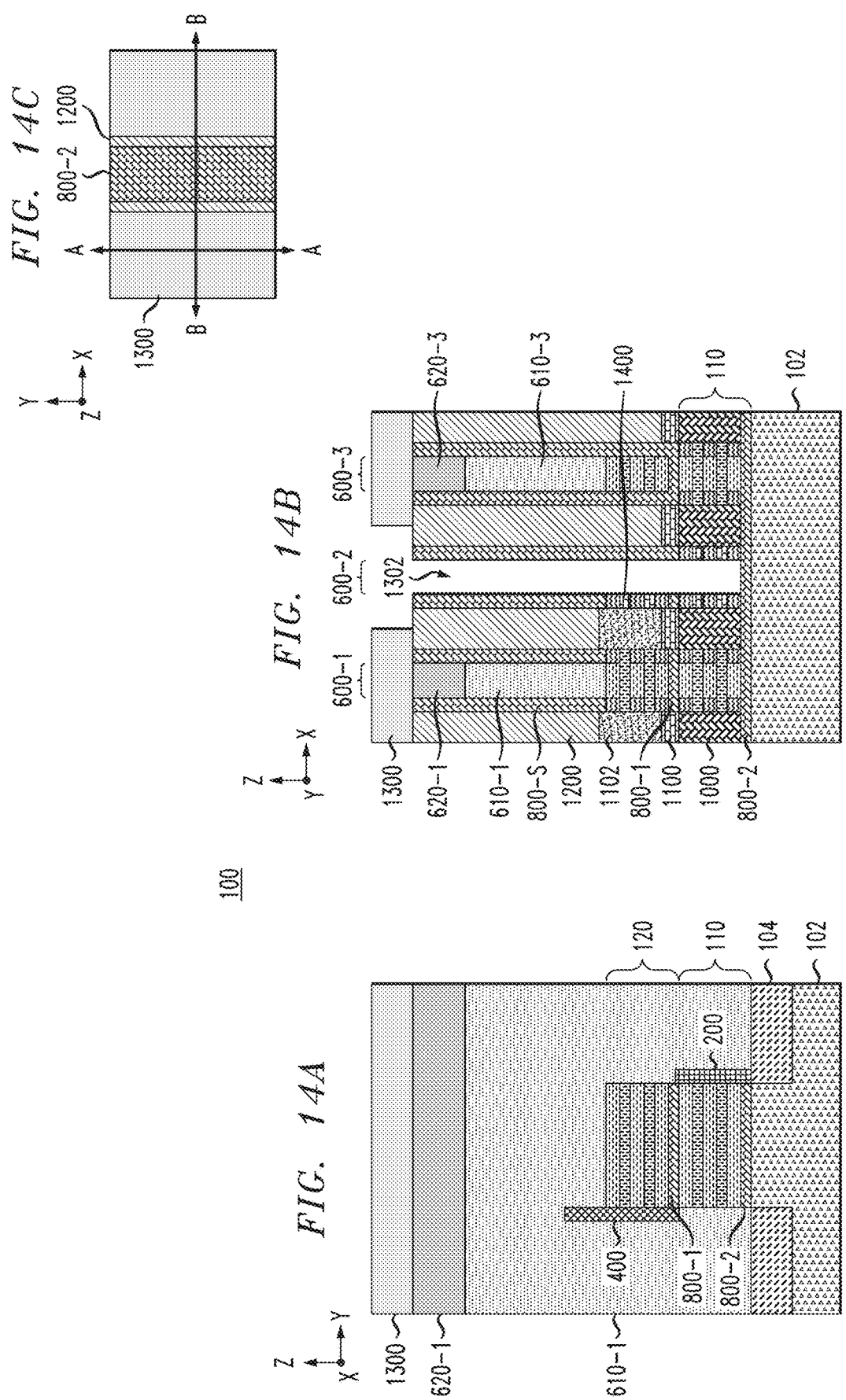

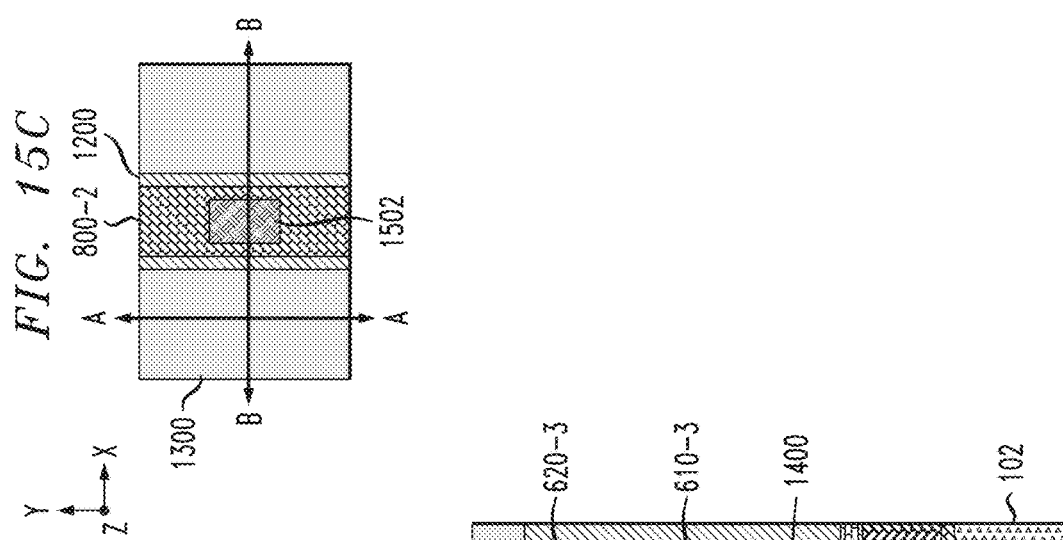
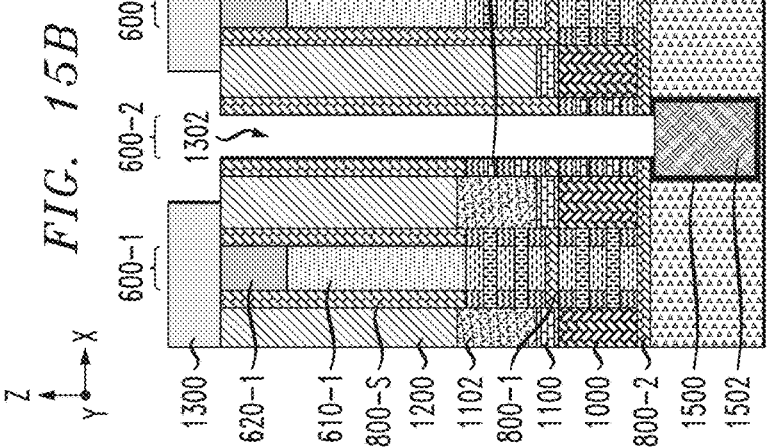
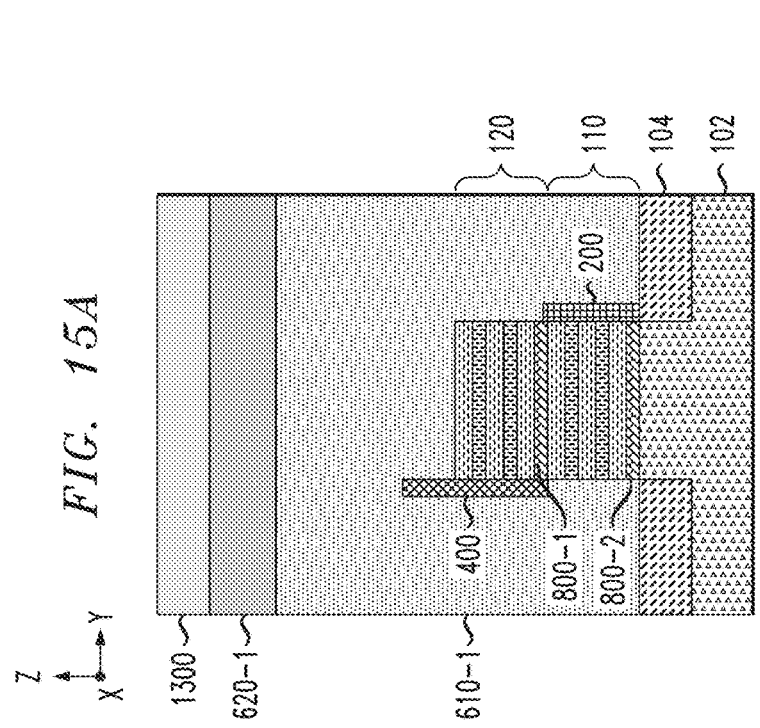

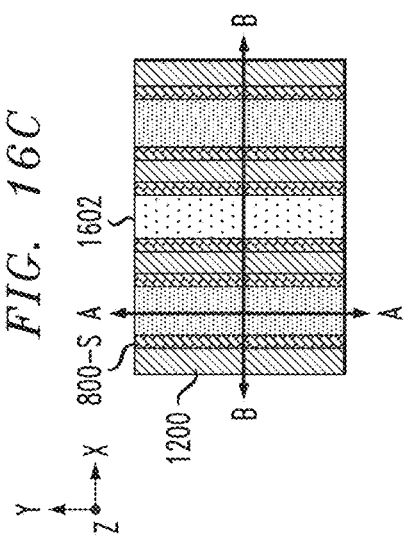
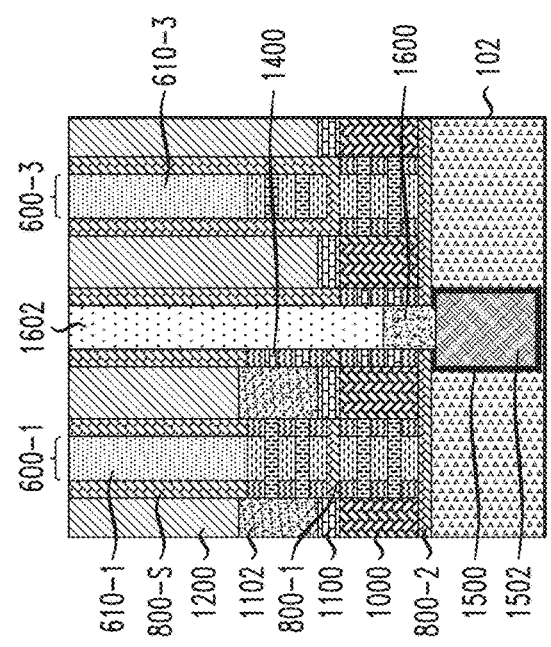
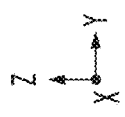

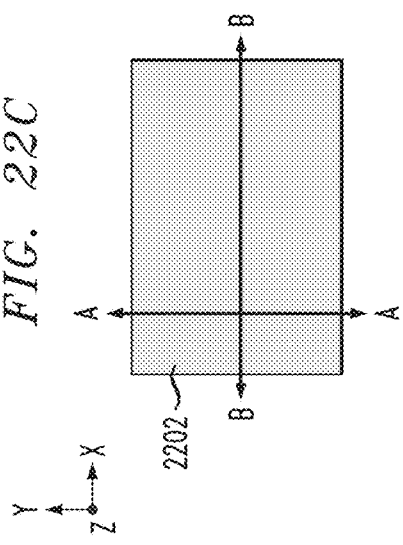
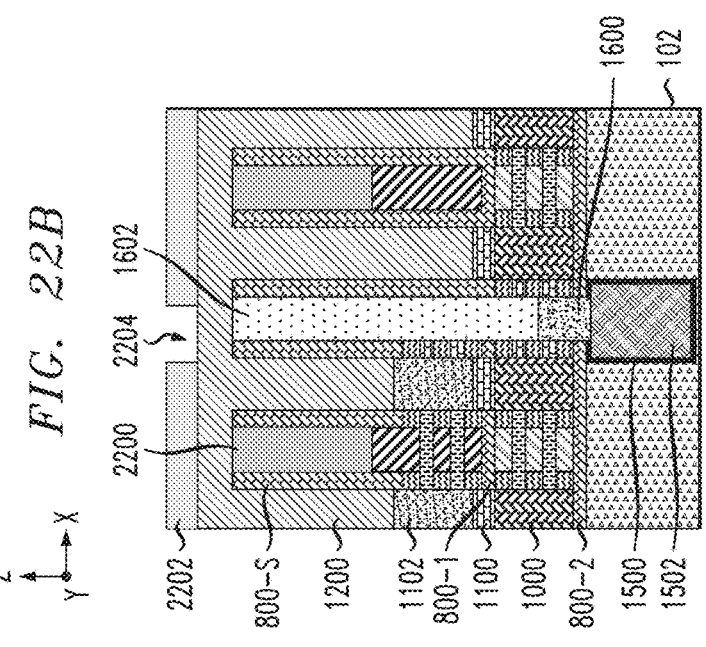
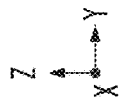

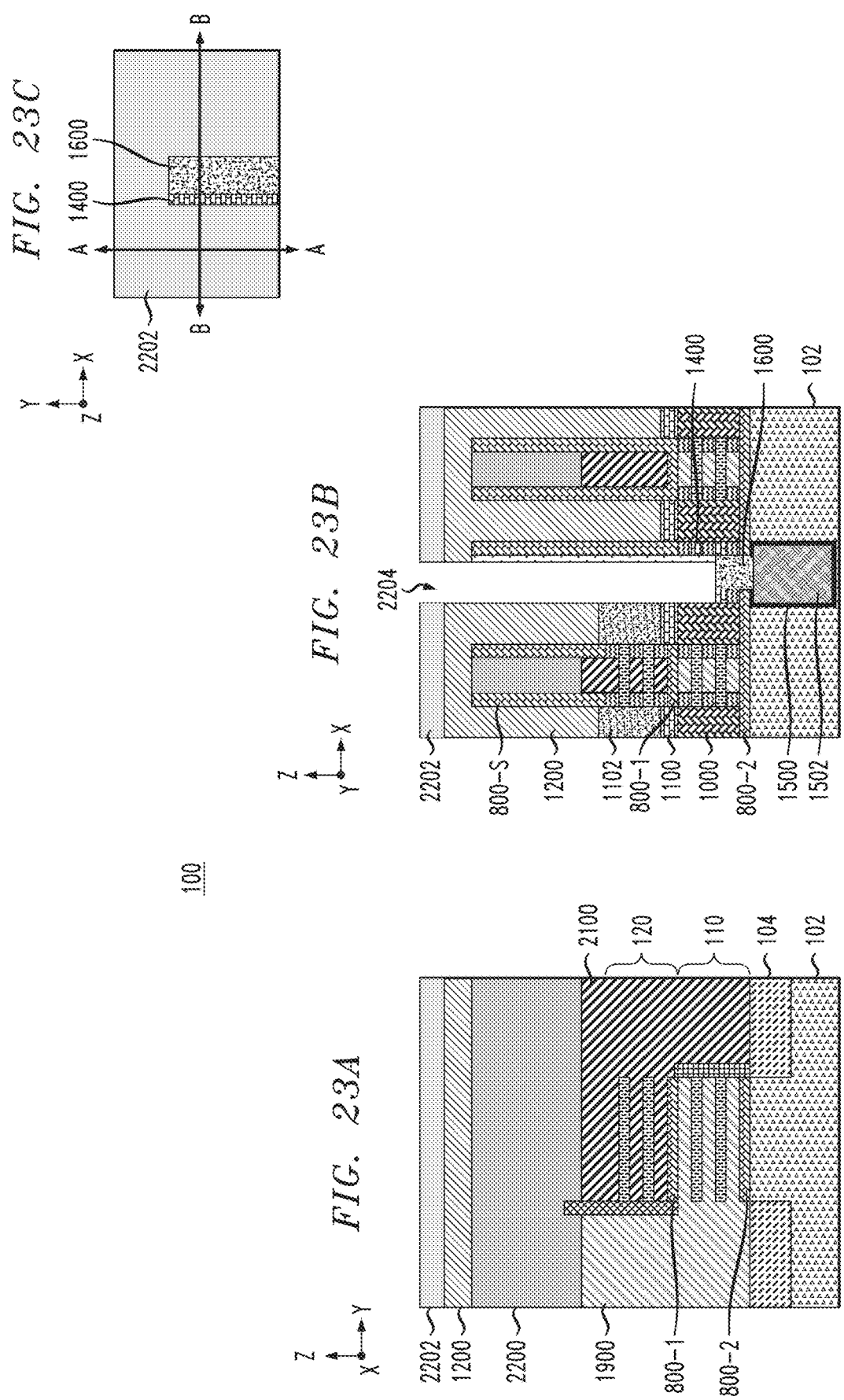

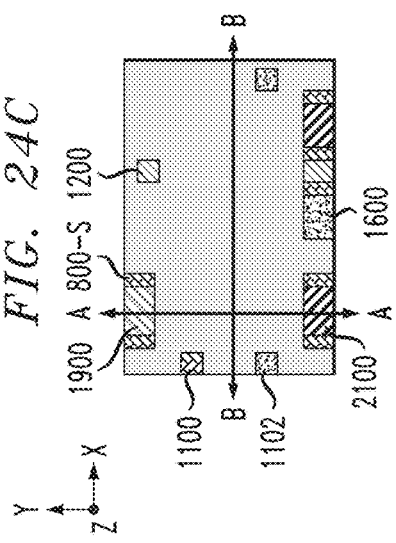
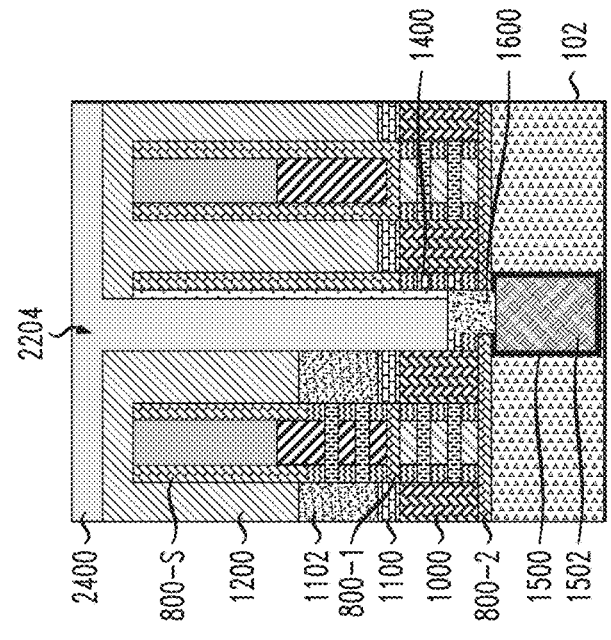
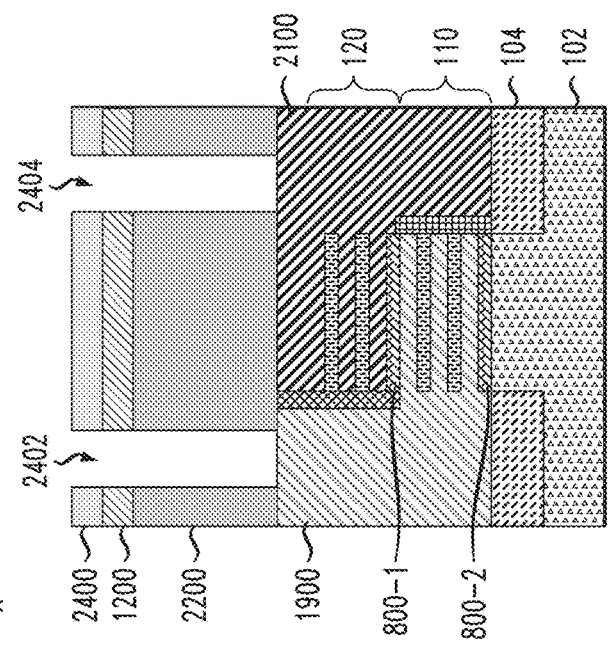

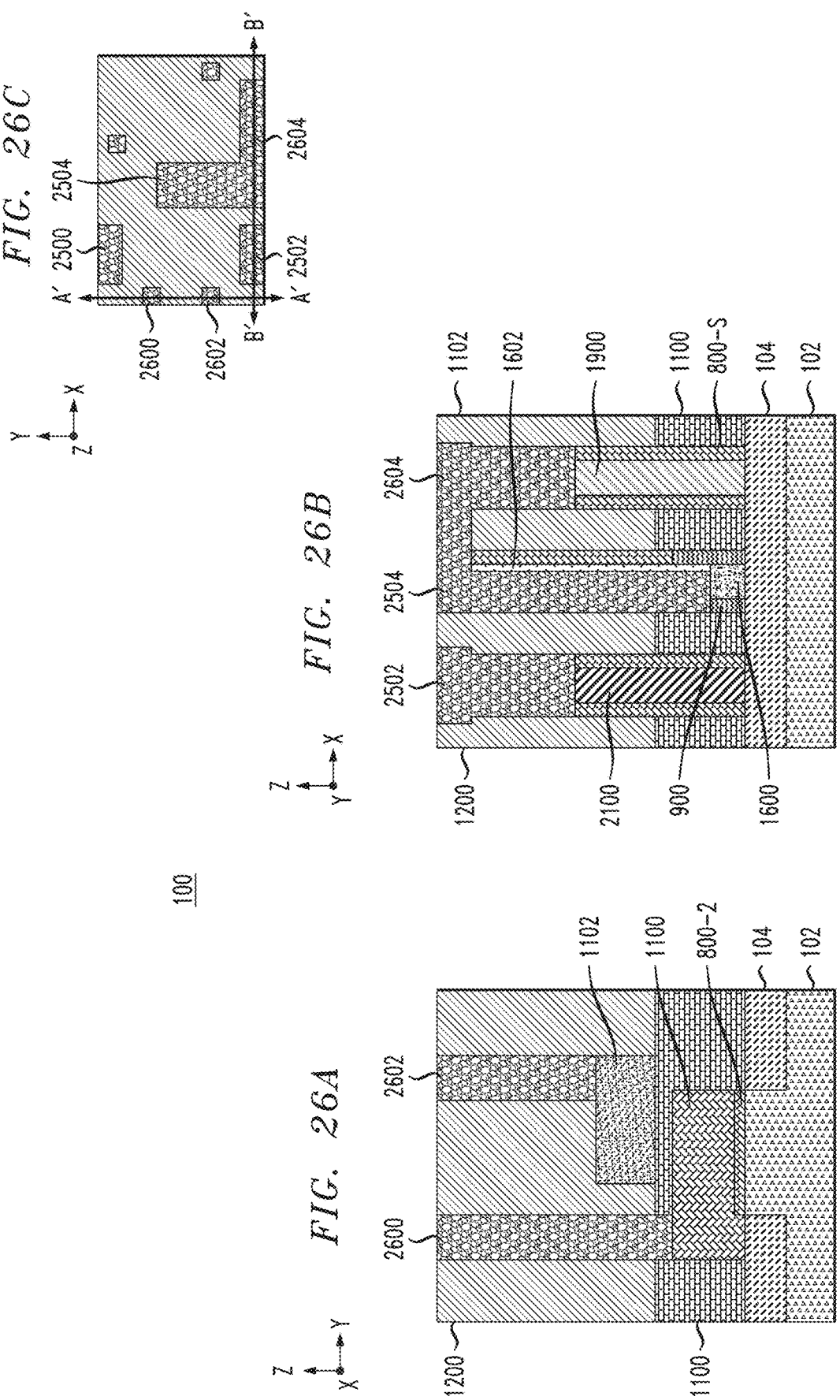

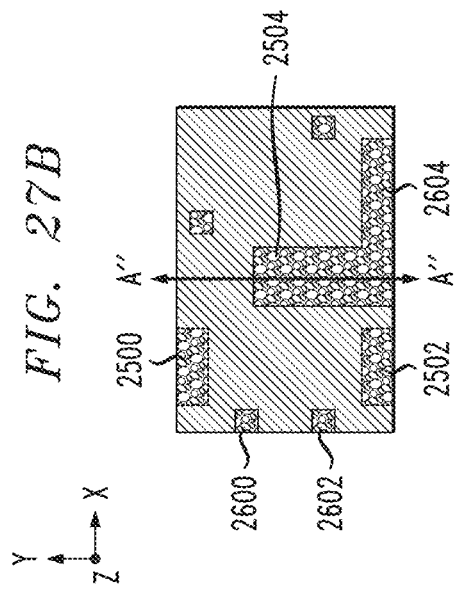
FIG. 27B
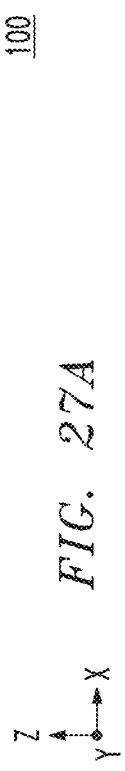
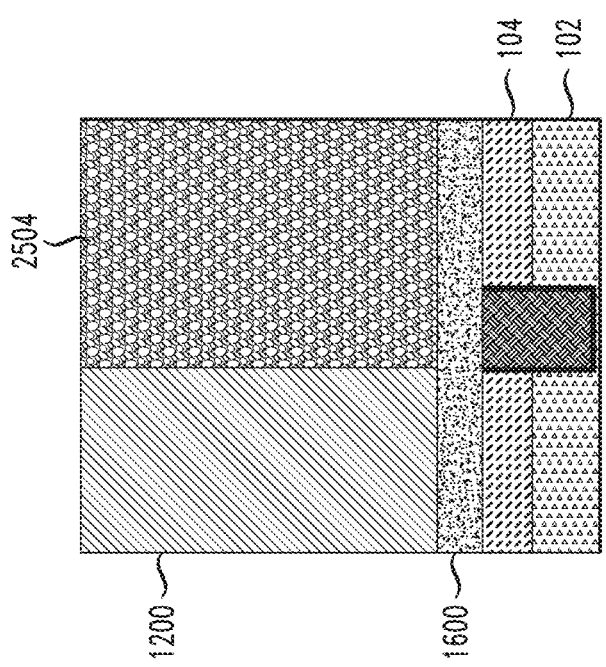
FIG. 27A

SEMICONDUCTOR STRUCTURE WITH EMBEDDED CAPACITOR

BACKGROUND

The field relates generally to semiconductor structures such as may be used in non-volatile analog resistive memory cells for neuromorphic computing. Information processing systems such as neuromorphic computing systems and artificial neural network (ANN) systems are utilized in various applications such as machine learning and inference processing for cognitive recognition and computing. Such systems are hardware-based systems that generally include a large number of highly interconnected processing elements (referred to as "artificial neurons") that operate in parallel to perform various types of computations. The artificial neurons (e.g., pre-synaptic neurons and post-synaptic neurons) are connected using artificial synaptic devices which provide synaptic weights that represent connection strengths between the artificial neurons. The synaptic weights can be implemented using analog memory elements, such as tunable resistive memory devices, which exhibit non-volatile and multi-level memory characteristics.

SUMMARY

Illustrative embodiments provide techniques for fabricating semiconductor structures and devices with stacked structures having embedded capacitors.

For example, in one illustrative embodiment, a semiconductor structure includes a substrate having a first region and a second region. The semiconductor structure further includes a capacitor structure disposed in the second region of the substrate. The capacitor structure includes a capacitor conductor and a dielectric insulator disposed between the capacitor conductor and the substrate. The semiconductor structure further includes a stacked device disposed on the first region of the substrate. The stacked device includes a first transistor and a second transistor. At least a portion of the second transistor is disposed under at least a portion of the first transistor. The first transistor and the second transistor are each coupled to the capacitor conductor.

In another illustrative embodiment, a semiconductor device includes a nanosheet field-effect transistor device disposed on a semiconductor substrate. The nanosheet field-effect transistor device includes a first nanosheet stack structure disposed on a first region of the semiconductor substrate, a second nanosheet stack structure disposed on the first nanosheet stack structure, a capacitor structure disposed in a second region of the semiconductor substrate and a third nanosheet stack structure disposed on a third region of the semiconductor substrate. The second region is disposed between the first region and the third region.

In yet another illustrative embodiment, a method for fabricating a semiconductor device includes forming a stacked device on a first region of a substrate. The substrate includes the first region and a second region. The stacked device includes a first transistor and a second transistor. At least a portion of the second transistor is disposed under the first transistor. The method further includes forming a capacitor opening in the second region of the substrate and forming a capacitor structure in the capacitor opening. The capacitor structure includes a capacitor conductor. The method further includes coupling the first transistor and the second transistor to the capacitor conductor.

Advantageously, in one or more illustrative embodiments, the semiconductor structures and devices formed in accordance therewith may be utilized as three transistor one capacitor (3T1C) circuits for use in a neuromorphic computing system. For example, such semiconductor devices may be utilized as 3T1C circuits for the handling near-term updates in the neuromorphic computing system in a manner that compensates for non-ideal switching behaviors of phase change memory (PCM) devices.

Other embodiments will be described in the following detailed description of embodiments, which is to be read in conjunction with the accompanying figures.

BRIEF DESCRIPTION OF THE DRAWINGS

FIGS. 1A and 1B are schematic views of a semiconductor structure at an intermediate stage of fabrication, according to an illustrative embodiment.

FIGS. 2A and 2B are schematic views of the semiconductor structure of FIGS. 1A and 1B after the formation of bottom nanosheet sidewall spacer, according to an illustrative embodiment.

FIGS. 3A and 3B are schematic views of the semiconductor structure of FIGS. 2A and 2B after the removal of the bottom nanosheet sidewall spacer on one side of the bottom nanosheet stack structure, according to an illustrative embodiment.

FIGS. 4A and 4B are schematic views of the semiconductor structure of FIGS. 3A and 3B after the formation of a top nanosheet sidewall spacer, according to an illustrative embodiment.

FIGS. 5A and 5B are schematic views of the semiconductor structure of FIGS. 4A and 4B after the removal of the top nanosheet sidewall spacer on one side of the top nanosheet stack structure, according to an illustrative embodiment.

FIGS. 8A-8C are schematic views of the semiconductor structure of FIGS. 7A-7C after the removal of the etch mask and spacer layers and the formation of dielectric sidewalls, a first dielectric interlayer and a second dielectric interlayer, according to an illustrative embodiment.

FIGS. 10A-10C are schematic views of the semiconductor structure of FIGS. 9A-9C after the formation of the bottom source/drain region on the exposed portions of the second dielectric interlayer between and around the bottom nanosheet stack structures of the gate structures, according to an illustrative embodiment.

FIGS. 12A-12C are schematic views of the semiconductor structure of FIGS. 11A-11C after the formation of an inter-level dielectric, according to an illustrative embodiment.

FIGS. 13A-13C are schematic views of the semiconductor structure of FIGS. 12A-12C after the formation and patterning of an etch mask that exposes the dummy gate electrode and gate capping layer of the second gate structure and after etching of the second gate structure and the bottom and top nanosheet stack structures and to expose the second dielectric interlayer and open a capacitor opening region, according to an illustrative embodiment.

FIGS. 14A-14C are schematic views of the semiconductor structure of FIGS. 13A-13C after the lateral etching of the nanosheet channel layers in the capacitor opening region and the formation of inner spacers in the laterally etched openings, according to an illustrative embodiment.

FIGS. 15A-15C are schematic views of the semiconductor structure of FIGS. 14A-14C after an etching of the semiconductor substrate under the second gate structure and the formation of an embedded capacitor structure in the semiconductor substrate, according to an illustrative embodiment.

FIGS. 16A-16C are schematic views of the semiconductor structure of FIGS. 15A-15C after the formation of a capacitor contact and dielectric cap over the embedded capacitor structure to fill in the capacitor opening region, according to an illustrative embodiment.

FIGS. 22A-22C are schematic views of the semiconductor structure of FIGS. 21A-21C after the formation of a capping layer, additional ILD and an etch mask on the gate stack layers, according to an illustrative embodiment.

FIGS. 23A-23C are schematic views of the semiconductor structure of FIGS. 22A-22C after etching is performed to extend the contact opening down to the dielectric cap, according to an illustrative embodiment.

FIGS. 24A-24C are schematic views of the semiconductor structure of FIGS. 23A-23C after forming an etch mask, patterning the etch mask and etching according to the patterning to form contact openings that expose the gate stack layers, according to an illustrative embodiment.

FIGS. 25A-25C, 26A-26C, 27A and 27B are schematic views of the semiconductor structure of FIGS. 24A-24C after removal of the etch mask and the formation of gate contacts, a capacitor contact, source/drain contacts and a gate/capacitor cross couple contact, according to an illustrative embodiment.

DETAILED DESCRIPTION

Figure 6C:
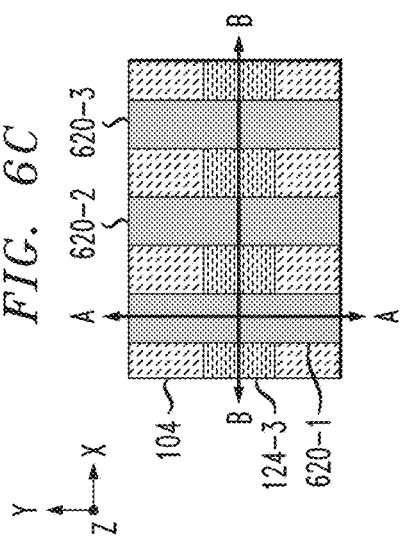
FIGS. 6A-6C are schematic views of the semiconductor structure of FIGS. 5A and 5B after the removal of the etch mask and nanosheet hard mask layer and the formation of dummy gates and the patterning of the three gate structures, according to an illustrative embodiment.

Illustrative embodiments will now be described in further detail below. Devices and methods are provided to fabricate a semiconductor structure comprising a nanosheet field-effect transistor device having an embedded capacitor.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

It is to be appreciated that the term "coupled" as illustratively used herein with respect to, for example, transistors or parts thereof being coupled to capacitors or parts thereof, refers to electrical connection.

To provide spatial context to the different structural orientations of the semiconductor device structures shown throughout the drawings, illustrative XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings. The term "top-down view" as used herein denotes a view in the Z-direction.

In general, neuromorphic computing utilizes very-large-scale integration (VLSI) systems containing analog circuits to mimic neuro-biological architectures present in the nervous system. For example, arrays of trainable resistive devices, referred to as resistive processing units (RPUs), can be used to form ANNs, which perform machine learning to learn and implement algorithms.

RPU architecture includes a plurality of non-volatile resistive elements, such as phase change devices, each in series with a FET connected in a diode configuration, that change their states after application of a certain voltage. For example, RPU devices are implemented with resistive random access memory (RRAM), phase change memory (PCM), programmable metallization cell (PMC) memory, non-linear memristive systems, or any other two-terminal devices that have non-linear resistive switching characteristics, and which have a tunable conductance (G) with variable conductance states over a range from a minimum conductance (Gmin) to a maximum conductance (Gmax). As noted above, neuromorphic computing systems and ANN systems are types of in-memory computing systems in which artificial neurons are connected using artificial synaptic devices to provide synaptic weights which represent the strength of connection between two artificial neurons. The synaptic weights can be implemented using tunable resistive memory devices, wherein the variable conductance states are used to represent the synaptic weights and to perform computations (e.g., vector-matrix multiplication). The conductance states of the analog resistive memory devices are encoded or otherwise mapped to synaptic weights.

Various types of artificial neural networks, such as deep neural networks (DNNs) and convolutional neural networks (CNNs) implement neuromorphic computing architectures for machine learning applications such as image recognition, object recognition, speech recognition, etc. The in-memory computations associated with such neural networks include, e.g., training computations in which the synaptic weights of the resistive memory cells are optimized by processing a training dataset, and forward inference computations in which the trained neural networks are used to process input data for purposes of, e.g., classifying the input data, predicting events based on the input data, etc.

DNN training generally relies on a backpropagation algorithm which includes three repeating cycles: forward, backward and weight update, which are repeated many times until a convergence criterion is met. The forward and backward cycles mainly involve computing vector-matrix multiplication in forward and backward directions. This operation can be performed on a 2D array of analog resistive memory cells. In a forward cycle, stored conductance values of the resistive memory devices in the 2D array form a matrix, and an input vector is transmitted as voltage pulses through each input row of the 2D array. In a backward cycle, voltage pulses are supplied from columns as an input, and a vector-matrix product is computed on the transpose of a matrix. The weight update involves calculating a vector-vector outer product which consists of a multiplication operation and an incremental weight update to be performed locally in each resistive memory cell within the 2D array.

A stochastically trained DNN comprising arrays of RPU cells can have synaptic weights implemented using tunable resistive memory devices. To properly train a DNN and achieve high-accuracy, the operating characteristics of the tunable resistive devices should meet a stringent set of specifications of acceptable RPU device parameters that a given DNN algorithm can tolerate without significant error penalty. These specifications include, for example, variations in the switching characteristics of the resistive memory device, such as, minimum incremental conductance change due to a single potentiation pulse, symmetry in up and down conductance changes, tunable range of the conductance values, etc.

In particular, one important specification for DNN training is that the RPU cells should have a tunable conductance with a resolution (or dynamic range) of, e.g., at least 1000 conductance levels (or steps), wherein the conductance levels can be switched (e.g., via 1-ns pulses) from a lowest conductance state to a highest conductance state in an analog and symmetrically incremental manner (with at least one order of magnitude of conductance difference between the maximum and minimum conductance state (on/off ratio)). To achieve symmetry of up/down changes of a minimum unit weight value in an RPU cell, each incremental increase and incremental decrease in the associated conductance level of the RPU cell should be the same amount or a similar amount, e.g., within a 5% mismatch error. In other words, tunable resistive RPU devices, which are analog in nature, should respond symmetrically in up and down conductance changes when provided the same but opposite pulse stimulus. In one example, the Up/Down symmetry should be equal to, e.g., 1.0±0.05. However, tunable resistive devices such as memristive devices (or memristors) typically exhibit variability in tuning/programming characteristics, making it difficult to achieve symmetric weight updates over the range (min-max) of conductance levels.

Up/Down symmetry is desirable for analog memory. However, it is difficult to obtain required specifications when using existing PCM and filamentary RRAM as the synaptic devices. Specifically, PCM elements are capable of being partially set, but exhibit abrupt reset characteristics, while filamentary RRAM elements exhibit gradual reset, but abrupt set characteristics.

As explained in further detail below, exemplary embodiments provide structures that compensate for such non-ideal switching behaviors. The embodiments provide a semiconductor structure comprising a nanosheet FET device having an embedded capacitor, which minimizes a device footprint by forming the capacitor under a dummy transistor gate.

In an illustrative embodiment, the semiconductor structure, including the capacitor, comprises a 3T1C (three transistor, one capacitor) circuit of an analog memory unit cell in an array of analog resistive memory cells. The 3T1C circuit may be utilized to perform near-term updates of volatile capacitors to compensate for non-ideal switching behaviors in PCM devices.

FIGS. 1A through 24C schematically illustrate a method for fabricating such a semiconductor structure comprising a nanosheet FET device having an embedded capacitor, according to an illustrative embodiment.

FIGS. 1A and 1B are schematic views of a semiconductor structure 100 at an intermediate stage of fabrication. FIG. 1B is a schematic top-down view (X-Y plane) of the semiconductor structure 100 and FIG. 1A is a schematic cross-sectional side view (Y-Z plane) of the semiconductor structure 100 along section line A-A. As illustrated in FIGS. 1A and 1B, the semiconductor structure 100 comprises a semiconductor substrate 102, a shallow trench isolation (STI) layer 104, a bottom nanosheet stack structure 110 formed on the semiconductor substrate 102, top nanosheet stack structure 120 formed on the bottom nanosheet stack structure 110, and a nanosheet hard mask layer 130 formed on the top nanosheet stack structure 120. In some embodiments, semiconductor structure 100 comprises an oxide layer disposed between the semiconductor substrate 102 and the bottom nanosheet stack structure 110 which may, for example, provide etch selectivity between the layers of the bottom nanosheet stack structure 110 and the semiconductor substrate 102.

While the semiconductor substrate 102 is illustrated as a generic substrate layer, it is to be understood that the semiconductor substrate 102 may comprise one of different types of semiconductor substrate structures and materials. For example, in one embodiment, the semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g., III-V), etc. In another embodiment, the semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the Y-Z plane represents a plane that is parallel to the plane of the semiconductor substrate 102 (e.g., wafer) being processed.

The STI layer 104 is formed of any type of insulating material, such an oxide material, which is suitable for the given fabrication process flow. In one embodiment, a patterning process is performed by forming an etch mask (e.g., a photoresist mask) having openings which define an image of the STI layer 104, and using the etch mask to etch semiconductor substrate 102 to form trenches at a depth below the upper surface of the semiconductor substrate 102. The etch mask can be formed using any suitable patterning process including, but not limited to, a photolithography process, or a multi-patterning process. The etching can be performed using one or more sequential dry etch processes with etch chemistries that are suitable to etch the semiconductor substrate 102. The insulating material (e.g., silicon oxide) can be deposited, planarized, and recessed using known techniques to form the STI layer 104.

The bottom nanosheet stack structure 110 comprises a spacer layer 112 and a stack semiconductor layers 114-1, 114-2, 114-3, 116-1 and 116-2. The top nanosheet stack structure 120 comprises a spacer layer 122 and stack of semiconductor layers 124-1, 124-2, 124-3, 126-1 and 126-2. The stack of semiconductor layers 114-1 through 116-2 of the bottom nanosheet stack structure 110 comprises sacrificial nanosheet layers 114-1, 114-2 and 114-3 and nanosheet channel layers 116-1 and 116-2. Similarly, the stack of semiconductor layers 124-1 through 126-2 of the top nanosheet stack structure 120 comprises sacrificial nanosheet layers 124-1, 124-2 and 124-3 and nanosheet channel layers 126-1 and 126-2. Sacrificial nanosheet layers 114-1, 114-2 and 114-3 are also referred to collectively and individually as sacrificial nanosheet layers 114. Nanosheet channel layers 116-1 and 116-2 are also referred to collectively and individually as nanosheet channel layers 116. Sacrificial nanosheet layers 124-1, 124-2 and 124-3 are also referred to collectively and individually as sacrificial nanosheet layers 124. Nanosheet channel layers 126-1 and 126-2 are also referred to collectively and individually as nanosheet channel layers 126.

Each nanosheet channel layer 116 is disposed between a pair of the sacrificial nanosheet layers 114 in the bottom nanosheet stack structure 110 and each nanosheet channel layer 126 is disposed between a pair of the sacrificial nanosheet layers 124 in the top nanosheet stack structure 120. The spacer layers 112 and 122 and the stacks of semiconductor layers 114-1 through 126-2 comprise epitaxial semiconductor layers that are sequentially grown.

For example, the spacer layer 112 is epitaxially grown on a surface of the semiconductor substrate 102, the sacrificial nanosheet layer 114-1 is epitaxially grown on the spacer layer 112, the nanosheet channel layer 116-1 is epitaxially grown on the sacrificial nanosheet layer 114-1, the sacrificial nanosheet layer 114-2 is epitaxially grown on the nanosheet channel layer 116-1, the nanosheet channel layer 116-2 is epitaxially grown on the sacrificial nanosheet layer 114-2, the sacrificial nanosheet layer 114-3 is epitaxially grown on the nanosheet channel layer 116-2, the spacer layer 122 is epitaxially grown on the sacrificial nanosheet layer 114-3, the sacrificial nanosheet layer 124-1 is epitaxially grown on the spacer layer 122, the nanosheet channel layer 126-1 is epitaxially grown on the sacrificial nanosheet layer 124-1, the sacrificial nanosheet layer 124-2 is epitaxially grown on the nanosheet channel layer 126-1, the nanosheet channel layer 126-2 is epitaxially grown on the sacrificial nanosheet layer 124-2 and the sacrificial nanosheet layer 124-3 is epitaxially grown on the nanosheet channel layer 126-2.

In one embodiment, the spacer and semiconductor layers 112 through 126-2 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The types of materials that are utilized to form the spacer and semiconductor layers 112 through 126-2 will depend on various factors such as the type of nanosheet FET device (p-type, or n-type), and the desired level of etch selectivity between the spacer and semiconductor layers, as well as providing sufficient lattice matching between the materials of the spacer and semiconductor layers to ensure proper (e.g., defect-free) epitaxial growth of the spacer and semiconductor layers 112 through 126-2.

For example, in one embodiment, the nanosheet channel layers 116 and 126 are formed of epitaxial silicon (Si), which is suitable to serve as semiconductor channel layers for a nanosheet FET device. When the nanosheet channel layers 116 and 126 are formed of crystalline Si, the sacrificial nanosheet layers 114 and 124, which serve as sacrificial layers that are subsequently etched away to release the nanosheet channel layers 116 and 126, can be formed of an epitaxial silicon-germanium (SiGe) alloy. This allows the epitaxial SiGe material of the sacrificial nanosheet layers 114 and 124 to be etched selective to the epitaxial Si material of the nanosheet channel layers 116 and 126 in a subsequent process step to "release" the nanosheet channel layers 116 and 126. In some embodiments, the Ge concentration of one or more of the sacrificial nanosheet layers 114 and 124 may be varied to provide etch selectivity between the sacrificial nanosheet layers 114 and 124.

In other embodiments, the nanosheet channel layers 116 and 126 may be formed of an epitaxial Si material, and the sacrificial nanosheet layers 114 and 124 can be formed of a sacrificial semiconductor material, e.g., SiGe with a desired Ge concentration, that can be etched selective to the nanosheet channel layers 116 and 126. While each of the bottom nanosheet stack structure 110 and top nanosheet stack structure 120 is shown to include two nanosheet channel layers 116 and 126, in other embodiments, one or both of the bottom and top nanosheet stack structure 110 and 120 can be fabricated with more or less than two nanosheet channel layers. Similarly, while each of the bottom nanosheet stack structure 110 and top nanosheet stack structure 120 is shown to include three sacrificial nanosheet layers 114 and 124, in other embodiments, one or both of the bottom and top nanosheet stack structure 110 and 120 can be fabricated with more or less sacrificial nanosheet layers 114 and 124.

In some embodiments, spacer layers 112 and 122 may also be formed of an epitaxial silicon-germanium (SiGe) alloy. In some embodiments, the spacer layers 112 and 122 may comprise an SiGe alloy having a high percentage of Ge while sacrificial nanosheet layers 114 and 124 may comprise SiGe alloys having a lower percentage of Ge than spacer layers 112 and 122, such that spacer layers 112 and 122 are selectively etchable relative to nanosheet channel layers 116 and 126 and sacrificial nanosheet layers 114 and 124. For example, in some embodiments, spacer layers 112 and 122 may comprise an SiGe alloy having a range of about 50% to about 90% Ge, sacrificial nanosheet layers 114 and 124 may comprise an SiGe alloy having a range of about 25% to 40% Ge and nanosheet channel layers 116 and 126 may comprise Si or an SiGe alloy having a range of about 5% to about 15% Ge where the spacer layers 112 and 122 and sacrificial nanosheet layers 114 and 124 are selectively etchable relative to each other and to nanosheet channel layers 116 and 126. In other embodiments, spacer layers 112, and 122, sacrificial nanosheet layers 114 and 124 and nanosheet channel layers 116 and 126 may comprise any other concentrations of Ge.

With continued reference to FIG. 1, the sacrificial nanosheet layers 114 and 124 may be formed with a thickness that defines the spacing size above and below the nanosheet channel layers 116 and 126, in which high-k dielectric material and work function metal will be formed. The size of the spacing and the type of WFM material(s) to be formed in the spaces above and below the nanosheet channel layers 116 and 126 defines, in part, the threshold voltage (Vt) of the nanosheet FET device. In one embodiment, the thickness of the sacrificial nanosheet layers 114 and 124 is in a range of about 8 nm to about 15 nm. In some embodiments, spacer layers 112 and 122 may be formed with a similar thickness to sacrificial nanosheet layers 114 and 124.

The thickness of the nanosheet channel layers 116 and 126 defines, in part, the threshold voltage (Vt) of the nanosheet FET device (e.g., Vt increases with decreasing channel thickness). In one embodiment, the thickness of the nanosheet channel layers 116 and 126 is in a range of about 5 nm to about 8 nm, although the nanosheet channel layers 116 and 126 can be formed with other thickness ranges, depending on the application.

A nanosheet hard mask layer 130 is formed over the top nanosheet stack structure 120. For example, a layer of SiN may be deposited over the entire surface of the semiconductor device structure covering the upper surface of the top nanosheet stack structure 120, followed by a lithographic patterning and etch process to etch the nanosheet hard mask layer 130 and down through the nanosheet stack structures 120 and 110 to the semiconductor substrate 102 to define the nanosheet stack. A dielectric may then be deposited and recessed to form the STI layer 104, e.g., using a CMP or other process.

FIGS. 2A and 2B are schematic views of a semiconductor structure 100 at an intermediate stage of fabrication after the formation of bottom nanosheet sidewall spacer 200. FIG. 2B is a top-down view (X-Y plane) of the semiconductor structure 100 and FIG. 2A is a schematic cross-sectional side view (Y-Z plane) of the semiconductor structure 100 along section line A-A. As illustrated in FIGS. 2A and 2B, bottom nanosheet sidewall spacer 200 is formed by depositing a conformal layer of dielectric material over the entire surface of the semiconductor device structure. The conformal layer of dielectric material can be formed of SiN, SiCN, SiON, BN, SiBN, SiBCN, SiOC, SiOCN, or any other type of dielectric material that is commonly used to form insulating nanosheet sidewall spacers of FET devices, and deposited using known techniques such as atomic layer deposition (ALD), CVD and PVD. The conformal layer of dielectric material is then patterned by performing an anisotropic dry etch process, such as ME, to etch down the conformal layer of dielectric material in a vertical direction. This etch process is performed selective to the materials of the STI layer 104, and nanosheet hard mask layer 130. The etch process results in the formation of the bottom nanosheet sidewall spacer 200, which surrounds the sidewall surfaces of the bottom nanosheet stack structure 110 and a portion of the spacer layer 122 of the top nanosheet stack structure 120, as shown in FIG. 2A. In one embodiment, the thickness of the bottom nanosheet sidewall spacer 200 is in a range of about 3 nm to about 10 nm, although the bottom nanosheet sidewall spacer 200 can be formed with other thickness ranges. At some point in the vertical etch process to form the bottom nanosheet sidewall spacer 200, the portions of the conformal layer of dielectric material on the lateral surfaces of the semiconductor device structure (e.g., on the upper surface of the nanosheet hard mask layer 130 and the upper surface of the STI layer 104) will be fully etched away, exposing the nanosheet hard mask layer 130 and the STI layer 104.

FIGS. 3A and 3B are schematic views of a semiconductor structure 100 at an intermediate stage of fabrication after the removal of the bottom nanosheet sidewall spacer 200 on one side of the bottom nanosheet stack structure 110. FIG. 3B is a top-down view (X-Y plane) of the semiconductor structure 100 and FIG. 3A is a schematic cross-sectional side view (Y-Z plane) of the semiconductor structure 100 along section line A-A. As illustrated in FIGS. 3A and 3B, a lithographic process is utilized to form an etch mask over a portion of the semiconductor structure 100. For example, an organic planarizing layer OPL may be coated on the semiconductor structure 100, followed by a lithographic process to pattern the OPL to form an etch mask 300. The OPL may comprise, for example, a resin material that is applied by spin coating and baked to enhance planarization. The patterned portion of the OPL is removed to expose a portion of the semiconductor structure 100 using standard lithographic techniques, for example, as shown in FIG. 3A. An etch process is utilized to remove an exposed portion of the bottom nanosheet sidewall spacer 200 where the etch chemistry may be selective to one or more of the materials of the STI layer 104, bottom nanosheet stack structure 110, top nanosheet stack structure 120, nanosheet hard mask layer 130 and etch mask 300. For example, dry or wet etching techniques may be utilized to remove the exposed portion of the bottom nanosheet sidewall spacer 200 in one or more steps. In some embodiments, a directional RIE process is utilized to remove the exposed portion of the bottom nanosheet sidewall spacer 200 with the chemistry being selective to the material of the STI layer 104, nanosheet hard mask layer 130 and etch mask 300.

FIGS. 4A and 4B are schematic views of a semiconductor structure 100 at an intermediate stage of fabrication after the formation of top nanosheet sidewall spacer 400. FIG. 4B is a top-down view (X-Y plane) of the semiconductor structure 100 and FIG. 4A is a schematic cross-sectional side view (Y-Z plane) of the semiconductor structure 100 along section line A-A. As illustrated in FIGS. 4A and 4B, an OPL is coated on the semiconductor structure 100 and etched back to mask the STI layer 104 and bottom nanosheet stack structure 110 and to laterally mask at least a portion of the bottom nanosheet sidewall spacer 200 with an etch mask 402. As seen in FIG. 4A, for example, the OPL is etched back to a vertical level such that the etch mask 402 covers nanosheet channel layer 114-3 but leaves at least a portion of spacer layer 122 exposed. In some embodiments, an upper surface of bottom nanosheet sidewall spacer 200 is also left exposed by the etch mask 402. In some embodiments, a portion of the bottom nanosheet sidewall spacer 200 that extends vertically above the nanosheet channel layer 114-3 may be left exposed by the etch mask 402, e.g., in the z-direction. In some embodiments, an upper surface of the etch mask 402 is co-planar or approximately co-planar with a bottom surface of the spacer layer 122.

Top nanosheet sidewall spacer 400 is formed by depositing a conformal layer of dielectric material over the entire surface of the semiconductor device structure including on the nanosheet hard mask layer 130, top nanosheet stack structure 120, exposed portions of the bottom nanosheet sidewall spacer 200 and etch mask 402. The conformal layer of dielectric material can be formed of SiN, SiCN, SiON, BN, SiBN, SiBCN, SiOC, SiOCN, or any other type of dielectric material that is commonly used to form insulating nanosheet sidewall spacers of FET devices, and deposited using known techniques such as atomic layer deposition (ALD), CVD and PVD. The conformal layer of dielectric material is then patterned by performing an anisotropic dry etch process, such as ME, to etch down the conformal layer of dielectric material in a vertical direction. This etch process is performed selective to the materials of the top nanosheet hard mask layer 130 and is also selective to the material of the etch mask 402. The etch process results in the formation of the top nanosheet sidewall spacer 400, which surrounds the sidewall surfaces of the top nanosheet stack structure 120 and a portion of the nanosheet hard mask layer 130, as shown in FIG. 4A. A portion of the top nanosheet sidewall spacer 400 also rests on the bottom nanosheet sidewall spacer 200, e.g., as shown in FIG. 4A. In one embodiment, the thickness of the top nanosheet sidewall spacer 400 is in a range of about 3 nm to about 10 nm, although the top nanosheet sidewall spacer 400 can be formed with other thickness ranges. At some point in the vertical etch process to form the top nanosheet sidewall spacer 400, the portions of the conformal layer of dielectric material on the lateral surfaces of the semiconductor device structure (e.g., on the upper surface of the nanosheet hard mask layer 130 and the upper surface of the etch mask 402) will be fully etched away, exposing the nanosheet hard mask layer 130 and the etch mask 402.

FIGS. 5A and 5B are schematic views of a semiconductor structure 100 at an intermediate stage of fabrication after the removal of the top nanosheet sidewall spacer 400 on one side of the top nanosheet stack structure 120. FIG. 5B is a top-down view (X-Y plane) of the semiconductor structure 100 and FIG. 5A is a schematic cross-sectional side view (Y-Z plane) of the semiconductor structure 100 along section line A-A. As illustrated in FIGS. 5A and 5B, a lithographic process is utilized to form an etch mask over a portion of the semiconductor structure 100. For example, an OPL may be coated on the semiconductor structure 100, followed by a lithographic process to pattern the OPL and form an etch mask 500. The OPL may comprise, for example, a resin material that is applied by spin coating and baked to enhance planarization. The patterned portion of the OPL is etched back such that etch mask 500 exposes a portion of the semiconductor structure 100 using standard lithographic techniques. For example, the patterned portion of the OPL may be etched back such that the etch mask 500 exposes the top nanosheet sidewall spacer 400 without also exposing the bottom nanosheet sidewall spacer 200. For example, the etch mask 500 may extend higher than the bottom nanosheet sidewall spacer 200 in the z-direction.

An etch process is utilized to remove an exposed portion of the top nanosheet sidewall spacer 400 where the etch chemistry may be selective to one or more of the materials of the top nanosheet stack structure 120, nanosheet hard mask layer 130 and etch mask 500. In some embodiments, bottom nanosheet sidewall spacer 200 and top nanosheet sidewall spacer 400 may be formed of different materials or different concentrations of materials where, for example, the etch chemistry may also be selective to the material of the bottom nanosheet sidewall spacer 200. For example, dry or wet etching techniques may be utilized to remove the exposed portion of the top nanosheet sidewall spacer 400 in one or more steps. In some embodiments, an isotropic etch process is utilized to remove the exposed portion of the top nanosheet sidewall spacer 400 with the chemistry being selective to the material of the nanosheet hard mask layer 130, etch mask 500 and, in some embodiments, the material of the top nanosheet sidewall spacer 400. In a case where the etch chemistry is not selective to the material of the bottom nanosheet sidewall spacer 200, the etching may be performed such that at least a portion of the bottom nanosheet sidewall spacer 200 is vertically higher than a bottom surface of the spacer layer 122 in the z-direction. In some embodiments, at least a portion of the bottom nanosheet sidewall spacer 200 may be in contact with or adjacent to the spacer layer 122 after the etching of the top nanosheet sidewall spacer 400 is complete.

Figure 6B:
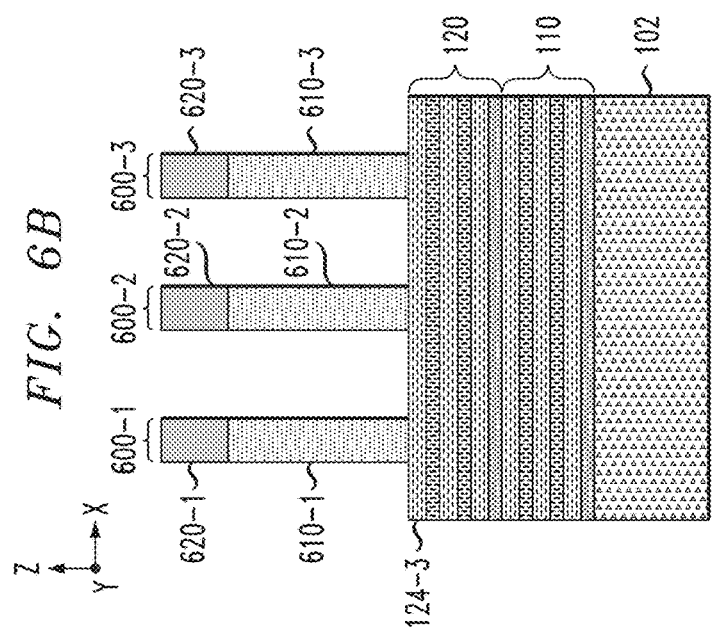
Figure 6A:
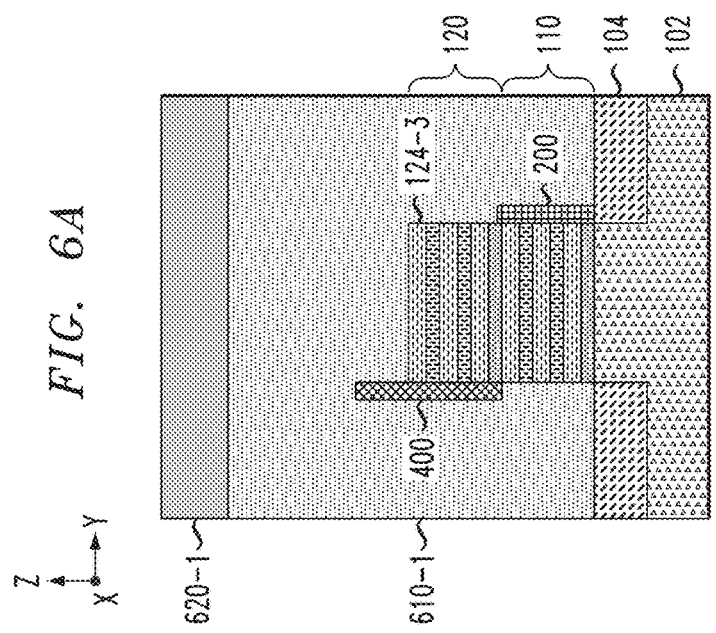

FIGS. 6A-6C are schematic views of a semiconductor structure 100 at an intermediate stage of fabrication after the removal of the etch mask 500 and nanosheet hard mask layer 130 and the formation of dummy gates and patterning of gate structures 600-1, 600-2, and 600-3. FIG. 6C is a top-down view (X-Y plane) of the semiconductor structure 100, FIG. 6A is a schematic cross-sectional side view (Y-Z plane) of the semiconductor structure 100 along section line A-A and FIG. 6B is a schematic cross-sectional side view (X-Z plane) of the semiconductor structure 100 along section line B-B.

Etch mask 500 and nanosheet hard mask layer 130 are removed, for example, by an etching process that is selective to the materials of STI layer 104, bottom and top nanosheet stack structures 110 and 120 and bottom and top nanosheet sidewall spacers 200 and 400. Dummy gate electrode material and gate capping material are formed over the semiconductor device structure and patterned into gate structures 600-1, 600-2 and 600-3, e.g., using standard deposition and lithographic processes.

For example, the dummy gate electrode layer may be formed by a blanket deposition of a sacrificial material such as polysilicon or amorphous silicon material over the semiconductor structure 100. In some embodiments, a conformal layer of silicon oxide may be deposited prior to the formation of the dummy gate electrode layer. A CMP process is performed to planarize the layer of sacrificial material, and a hard mask layer is formed on the planarized surface of the polysilicon layer by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers.

The hard mask layer is then patterned to form the gate capping layers 620-1, 620-2 and 620-3 of the gate structures 600-1, 600-2 and 600-3, which define an image of the dummy gate structure. Gate capping layers 620-1, 620-2 and 620-3 are also collectively and individually referred to herein as gate capping layer(s) 620. Gate structures 600-1, 600-2 and 600-3 are also collectively and individually referred to herein as gate structures(s) 600.

The gate capping layers 620 are then utilized as an etch hardmask to anisotropically etch (e.g., RIE) the sacrificial polysilicon layer to thereby form the dummy gate electrodes 610-1, 610-2 and 610-3 of the gate structures 600, also collectively and individually referred to herein as dummy gate electrode(s) 610. In illustrative embodiments, the etching chemistry is selective to the materials of the bottom and top nanosheet stack structures 110 and 120 (including sacrificial nanosheet layer 124-3), the bottom and top nanosheet sidewall spacers 200 and 400, and the STI layer 104.

Figure 7C:
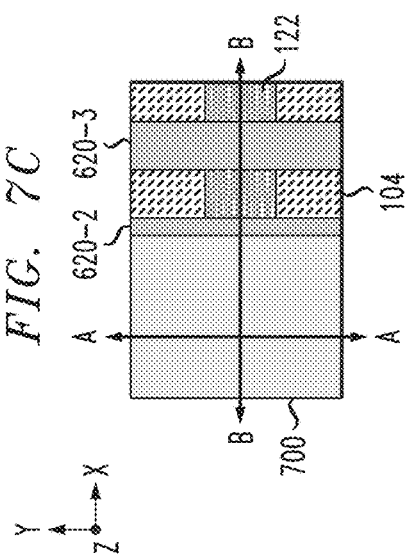
FIGS. 7A-7C are schematic views of the semiconductor structure of FIGS. 6A-6C after exposing the spacer layer in the regions adjacent to the third gate structure and between the third and second gate structures, according to an illustrative embodiment.
Figure 7B:
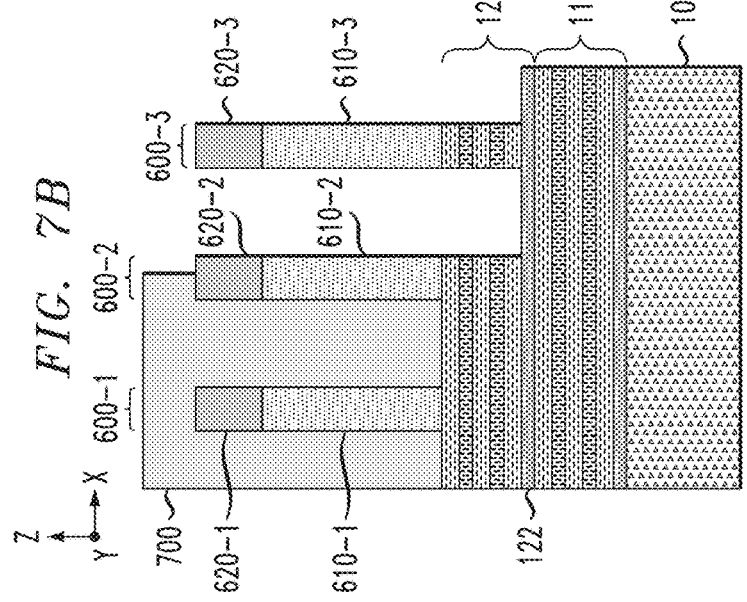
Figure 7A:
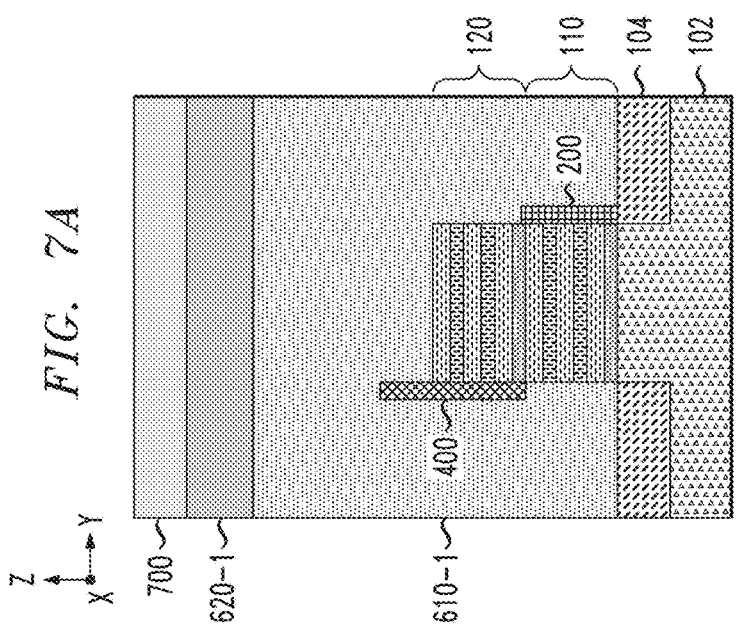

FIGS. 7A-7C are schematic views of a semiconductor structure 100 at an intermediate stage of fabrication after removing the top nanosheet stack structure 120 and exposing the spacer layer 122 in the regions adjacent to gate structure 600-3 and between gate structure 600-3 and gate structure 600-2. FIG. 7C is a top-down view (X-Y plane) of the semiconductor structure 100, FIG. 7A is a schematic cross-sectional side view (Y-Z plane) of the semiconductor structure 100 along section line A-A and FIG. 7B is a schematic cross-sectional side view (X-Z plane) of the semiconductor structure 100 along section line B-B. As illustrated in FIGS. 7A-7C, a lithographic process is utilized to form an etch mask 700 over a portion of the semiconductor structure 100 including gate structure 600-1 and at least a portion of gate structure 600-2. For example, an OPL may be coated on the semiconductor structure 100, followed by a lithographic process to pattern the OPL and form the etch mask 700. The OPL may comprise, for example, a resin material that is applied by spin coating and baked to enhance planarization. The patterned portion of the OPL is removed such that etch mask 700 exposes the top nanosheet stack structure 120 in regions adjacent to the gate structure 600-3 and between gate structure 600-3 and gate structure 600-2. A directional etch process, e.g., a directional RIE process, is utilized to etch top nanosheet stack structure 120 down to the spacer layer 122. For example, the etch chemistry may be selective to the material of the gate capping layers 620, the spacer layer 122 and the etch mask 700.

FIGS. 8A-8C are schematic views of a semiconductor structure 100 at an intermediate stage of fabrication after the removal of the etch mask 700 and spacer layers 112 and 122 and the formation of dielectric sidewalls 800-S, a first dielectric interlayer 800-1 and a second dielectric interlayer 800-2. FIG. 8C is a schematic side view (X-Y plane) of the semiconductor structure 100, FIG. 8A is a schematic cross-sectional side view (Y-Z plane) of the semiconductor structure 100 along section line A-A and FIG. 8B is a schematic cross-sectional side view (X-Z plane) of the semiconductor structure 100 along section line B-B.

As illustrated in FIGS. 8A-8C, one or more etch process are utilized to remove the etch mask 700 and the spacer layers 112 and 122. In some embodiments, dry or wet etch processes may be utilized to remove etch mask 700 and also etch spacer layers 112 and 122 without removing the semiconductor layers of the bottom and top nanosheet stack structures 110 and 120. For example, the etch chemistry and process may be selective to the materials of the semiconductor substrate 102, STI layer 104, semiconductor layers 114, 116, 124 and 126, dummy gate electrodes 610 and gate capping layers 620. For example, the etch chemistry may be configured to remove the SiGe alloy concentration of the spacer layers 112 and 122, e.g., 60%, while being selective to the lower concentrations of Ge found in semiconductor layers 114, 116, 124 and 126. In some embodiments, a wet etch process may be utilized to remove the spacer layers 112 and 122. In one embodiment, the SiGe material of the spacer layers 112 and 122 can be selectively etched (with high etch selectivity) using a gas phase HCl (hydrochloric acid) or wet etch solution to laterally etch the SiGe material of the spacer layers 112 and 122 selective to the Si material of the sacrificial nanosheet layers 114, sacrificial nanosheet layers 124, nanosheet channel layers 116 and nanosheet channel layers 126. The gas phase HCl (hydrochloric acid) provides high etch selectivity when, for example, the sacrificial nanosheet layers 114 and 124 and the nanosheet channel layers 116 and 126 are formed of Si or SiGe with a lower Ge concentration than the SiGe material of the spacer layers 112 and 122.

A dielectric layer is then formed on the semiconductor structure 100 to fill the space left by the removal of spacer layers 112 and 122 and to form sidewall spacers for the gate structures 600-1, 600-2 and 600-3 on the lateral surfaces of the dummy gate electrodes 610 and gate capping layers 620. For example, the dielectric layer may be formed by depositing one or more conformal layers of dielectric material over the exposed surfaces of the semiconductor structure 100 including the exposed surfaces of the bottom and top nanosheet stack structures 110 and 120, dummy gate electrodes 610 and gate capping layers 620. The dielectric material is also deposited on the surfaces of the semiconductor substrate 102 and sacrificial nanosheet layers 114-1, 114-3, 124-1 and 124-3 that were exposed by removal of the spacer layers 112 and 122. In some embodiments, the dielectric layer may be formed of a dielectric material having a dielectric constant (k) of about ranging from 4.0 to 7.0.

For example, the dielectric material used to form the dielectric layer can include but is not limited to SiN, SiOCN, SiBCN, SiOC, etc. In some embodiments, the dielectric material is formed such that the space between the semiconductor substrate 102 and sacrificial nanosheet layer 114-1, and the space between sacrificial nanosheet layers 114-3 and 124-1 are filled. The conformal layer of dielectric material is deposited using known methods such as ALD, for example, which allows for high conformality of the dielectric material.

The deposited dielectric material of the dielectric layer is etched back to expose the gate capping layers 620 and the sacrificial nanosheet layers 114-3 and 124-3 while leaving the dielectric sidewalls 800-S on the lateral walls of the gate structures 600, the first dielectric interlayer 800-1 between sacrificial nanosheet layers 114-3 and 124-1 and the second dielectric interlayer 800-2 between sacrificial nanosheet layer 114-1 and semiconductor substrate 102, for example, as seen in FIG. 8B. In some embodiments, an anisotropic RIE process, may be utilized for the spacer ME.

Figure 9C:
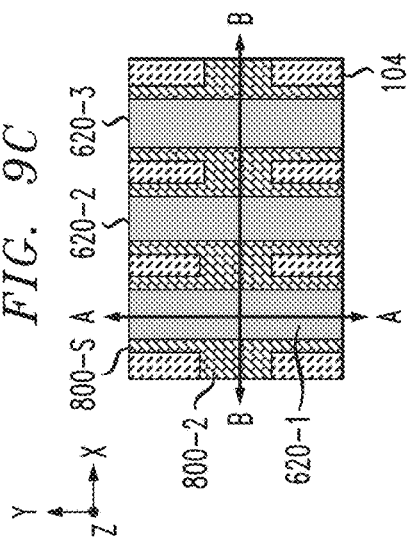
FIGS. 9A-9C are schematic views of the semiconductor structure of FIGS. 8A-8C after etching of the bottom and top nanosheet stack structures between and around the gate structures down to the second dielectric interlayer and the formation of the inner spacers, according to an illustrative embodiment.
Figure 9B:
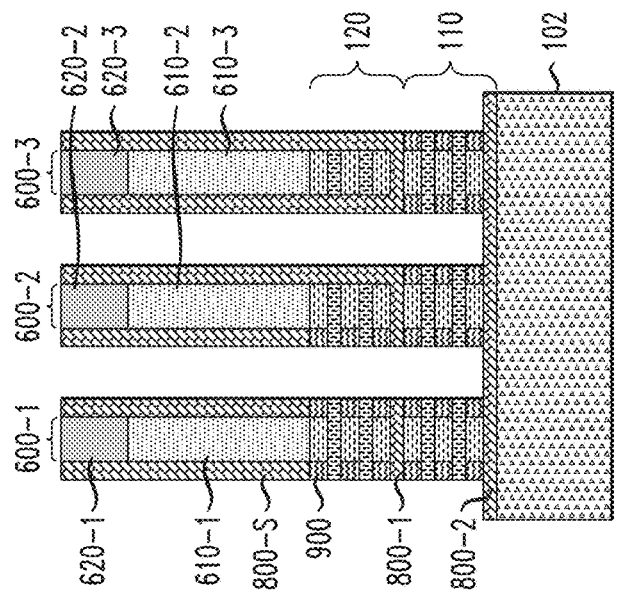
Figure 9A:
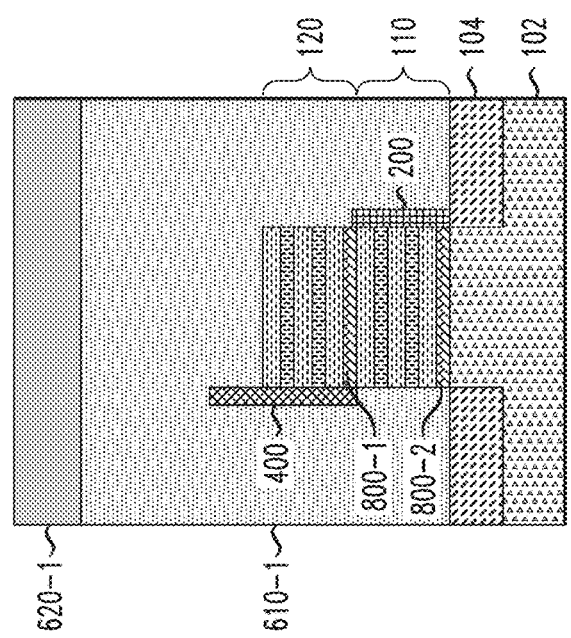

FIGS. 9A-9C are schematic views of a semiconductor structure 100 at an intermediate stage of fabrication after etching of the bottom and top nanosheet stack structures 110 and 120 between and around the gate structures 600 down to the second dielectric interlayer 800-2 and the formation of inner spacers 900. FIG. 9C is a top-down view (X-Y plane) of the semiconductor structure 100, FIG. 9A is a schematic cross-sectional side view (Y-Z plane) of the semiconductor structure 100 along section line A-A and FIG. 9B is a schematic cross-sectional side view (X-Z plane) of the semiconductor structure 100 along section line B-B.

For example, one or more etch processes, e.g., directional ME processes, may be utilized to etch top nanosheet stack structure 120 down to the first dielectric interlayer 800-1 between and around the gate structures 600, to remove the portion of first dielectric interlayer 800-1 that is between and around the gate structures 600, and to etch the bottom nanosheet stack structure 110 down to the second dielectric interlayer 800-2. As an example, the dielectric sidewalls 800-S and the gate capping layers 620 may be used as an etch mask for the removal of the semiconductor layers of the top nanosheet stack structure 120 during a first etching process that is selective to the materials of the dielectric sidewalls 800-S and the gate capping layers 620. In some embodiments, the dielectric sidewalls 800-S and the gate capping layers 620 may be used as an etch mask for the removal of the semiconductor layers of the bottom nanosheet stack structure 110 down to the second dielectric interlayer 800-2 during a third etching process that is selective to the materials of the dielectric sidewalls 800-S, second dielectric interlayer 800-2 and the gate capping layers 620.

In one embodiment, the inner spacers 900 are formed by a process which comprises laterally recessing exposed sidewall surfaces of sacrificial nanosheet layers 114 and 124 of the bottom and top nanosheet stack structures 110 and 120 to form recesses in the sidewalls of the bottom and top nanosheet stack structures 110 and 120 that are not protected by the dielectric sidewalls 800-S. As shown in FIG. 9B, the exposed sidewall surfaces of the sacrificial nanosheet layers 114 and 124 are laterally recessed to a pre-determined depth (e.g., in the x-direction). The amount of lateral recess is controlled through a timed etch. In one embodiment, the depth of the recess is substantially equal to the thickness of the dielectric sidewalls 800-S.

In one illustrative embodiment, the lateral etch process can be performed using an isotropic wet etch process with an etch solution that is suitable to etch the semiconductor material (e.g., SiGe) of the sacrificial nanosheet layers 114 and 124 selective to the semiconductor material (e.g., Si) of the nanosheet channel layers 116 and 126, dielectric sidewalls 800-S and other exposed elements. In another embodiment, an isotropic dry plasma etch process can be performed to laterally etch the exposed sidewall surfaces of the sacrificial nanosheet layers 114 and 124 selective to the nanosheet channel layers 116 and 126, dielectric sidewalls 800-S and other exposed elements.

The recesses are then filled with dielectric material to form the inner spacers 900 (or embedded spacers) on the sidewalls of the bottom and top nanosheet stack structures 110 and 120. In one embodiment, the inner spacers 900 are formed by depositing a conformal layer of dielectric material over the semiconductor device structure until the recesses are filled with dielectric material, followed by an isotropic etch back to remove the excess dielectric material. In one embodiment, the inner spacers 900 are formed of the same dielectric material used to form the dielectric sidewalls 800-S. For example, the inner spacers 900 can be formed of SiN, SiBCN, SiCON, or any other type of dielectric material (e.g., a low-k dielectric material having a k of less than 5) which is commonly used to form insulating nanosheet sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the bottom and top nanosheet stack structures 110 and 120 and expose the sidewalls of the nanosheet channel layers 116 and 126 while leaving the dielectric material in the recesses to form the inner spacers 900. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), hot phosphorus or any combination thereof.

FIGS. 10A-10C are schematic views of a semiconductor structure 100 at an intermediate stage of fabrication after the formation of the bottom source/drain region 1000 on the exposed portions of the second dielectric interlayer 800-2 between and around the bottom nanosheet stack structures 110 of the gate structures 600. FIG. 10C is a top-down view (X-Y plane) of the semiconductor structure 100, FIG. 10A is a schematic cross-sectional side view (Y-Z plane) of the semiconductor structure 100 along section line A-A and FIG. 10B is a schematic cross-sectional side view (X-Z plane) of the semiconductor structure 100 along section line B-B.

The bottom source/drain regions 1000 may be formed, for example, by implantation of a suitable dopant, such as using in-situ doping during expitaxy growth, ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain regions 1000 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1\times10^{19}$ $cm^{-3}$ to $3\chi10^{21}$ $cm^{-3}$, or preferably between $2\times10^{20}$ $cm^{-3}$ to $3\times10^{21}$ $cm^{-3}$.

In some embodiments, as shown in FIG. 10B, the bottom source/drain regions 1000 may be formed or grown over the exposed nanosheet channel layers 116 and 126, and then any epitaxy grown over top nanosheet channel layer 126 is recessed or patterned back to the desired height relative to the first dielectric interlayer 800-1 in the z-direction.

Figure 11C:
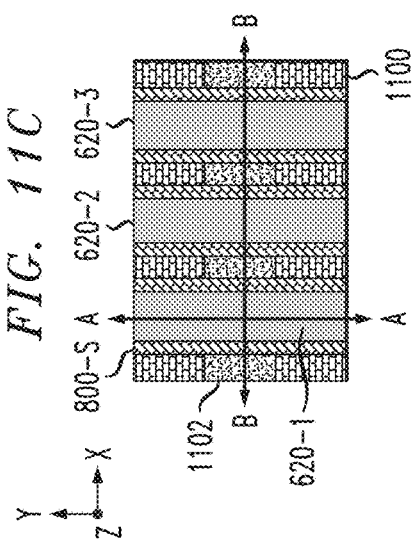
FIGS. 11A-11C are schematic views of the semiconductor structure of FIGS. 10A-10C after the formation of a bottom spacer on the bottom source/drain regions and STI layer and the formation of a top source/drain region on the bottom spacer between the first and second gate structures and around the first gate structure, according to an illustrative embodiment.
Figure 11B:
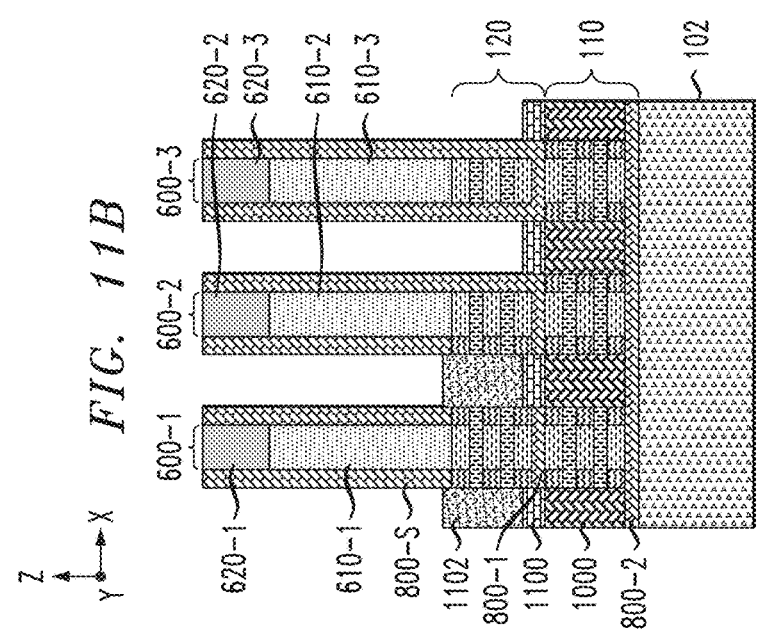
Figure 11A:
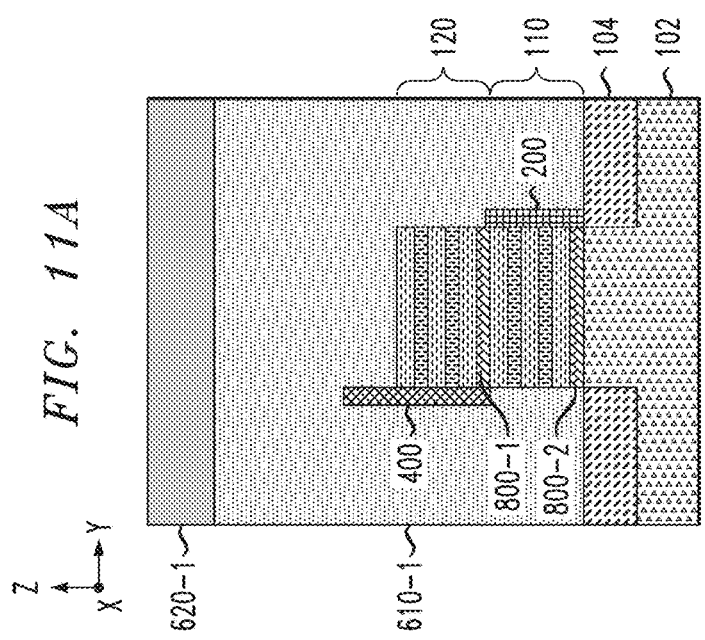

FIGS. 11A-11C are schematic views of a semiconductor structure 100 at an intermediate stage of fabrication after the formation of a bottom spacer 1100 on the bottom source/drain regions 1000 and STI layer 104 and the formation of a top source/drain region 1102 on the bottom spacer 1100 between gate structures 600-1 and 600-2 and around gate structure 600-1. FIG. 11C is a top-down view (X-Y plane) of the semiconductor structure 100, FIG. 11A is a schematic cross-sectional side view (Y-Z plane) of the semiconductor structure 100 along section line A-A and FIG. 11B is a schematic cross-sectional side view (X-Z plane) of the semiconductor structure 100 along section line B-B.

The bottom spacer 1100 includes, but is not necessarily limited to, silicon boron nitride (SiBN), siliconborocarbonitride (SiBCN), silicon oxycarbonitride (SiOCN), SiN or SiOx. According to an exemplary embodiment, the bottom spacer 1100 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Spacer material from the formation of bottom spacer 1100 formed on the gate capping layers 620 can be removed using a planarization process, such as, for example, CMP. Alternatively, the bottom spacer 1100 can be formed by overfill ILD dielectric followed by CMP and recess processes.

Top source/drain regions 1102 are formed over the bottom spacer 1100 between gate structures 600-1 and 600-2 and around gate structure 600-1. The top source/drain regions 1102 may be formed of similar materials and with similar processing as that described above with respect to bottom source/drain regions 1000.

FIGS. 12A-12C are schematic views of a semiconductor structure 100 at an intermediate stage of fabrication after the formation of an inter-level dielectric (ILD) 1200. FIG. 12C is a top-down view (X-Y plane) of the semiconductor structure 100, FIG. 12A is a schematic cross-sectional side view (Y-Z plane) of the semiconductor structure 100 along section line A-A and FIG. 12B is a schematic cross-sectional side view (X-Z plane) of the semiconductor structure 100 along section line B-B.

For example, a dielectric material, including, but not limited to SiO$_x$, low temperature oxide (LTO), high temperature oxide (HTO), flowable oxide (FOX) or some other dielectric, is deposited to form an ILD 1200 on the bottom spacer 1100 and top source/drain region 1102. The ILD 1200 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD 1200 and planarize the resulting structure. The planarization can be performed down to the gate capping layers 620 on the gate structures 600 such that the gate capping layers 620 are exposed. In accordance with an exemplary embodiment, the ILD 1200 electrically isolates the different gate structures 600 from each other.

FIGS. 13A-13C are schematic views of a semiconductor structure 100 at an intermediate stage of fabrication after the formation and patterning of an etch mask 1300 that exposes the dummy gate electrode 610-2 and gate capping layer 620-2 of gate structure 600-2 and after etching of the gate structure 600-2 and the bottom and top nanosheet stack structures 110 and 120 to expose the second dielectric interlayer 800-2 and open a capacitor opening region 1302. FIG. 13C is a top-down view (X-Y plane) of the semiconductor structure 100, FIG. 13A is a schematic cross-sectional side view (Y-Z plane) of the semiconductor structure 100 along section line A-A and FIG. 13B is a schematic cross-sectional side view (X-Z plane) of the semiconductor structure 100 along section line B-B.

Etch mask 1300 may be formed using a lithographic patterning process on the semiconductor structure 100. For example, an organic planarizing layer OPL may be coated on the semiconductor structure 100, followed by a lithographic process to pattern the OPL to form etch mask 1300. The OPL may comprise, for example, a resin material that is applied by spin coating and baked to enhance planarization. The patterned portion of the OPL is removed to expose a portion of the semiconductor structure 100 using standard lithographic techniques, for example, as shown in FIG. 3B. For example, the etch mask 1300 exposes the gate capping layer 620-2 of gate structure 600-2 while protecting gate structures 600-1 and 600-3. One or more etch processes, e.g., dry or wet etching techniques, are utilized to remove the exposed gate capping layer 620-2, the dummy gate electrode 610-2, the portion of the top nanosheet stack structure 120 under the gate structure 600-2, the portion of the bottom spacer 1100 under the gate structure 600-2, and the bottom nanosheet stack structure 110 under the gate structure 600-2 in one or more steps to expose the second dielectric interlayer 800-2 under the gate structure 600-2 by opening the capacitor opening region 1302. In some embodiments, a directional RIE process may be utilized with the chemistry being selective to the material of the ILD 1200, dielectric sidewalls 800-S and the second dielectric interlayer 800-2.

FIGS. 14A-14C are schematic views of a semiconductor structure 100 at an intermediate stage of fabrication after the lateral etching of the nanosheet channel layers 116 and 126 in the capacitor opening region 1302 and the formation of inner spacers 1400 in the laterally etched openings. FIG. 14C is a top-down view (X-Y plane) of the semiconductor structure 100, FIG. 14A is a schematic cross-sectional side view (Y-Z plane) of the semiconductor structure 100 along section line A-A and FIG. 14B is a schematic cross-sectional side view (X-Z plane) of the semiconductor structure 100 along section line B-B.

In one embodiment, the inner spacers 1400 are formed by a process which comprises laterally recessing exposed sidewall surfaces of nanosheet channel layers 116 and 126 of the bottom and top nanosheet stack structures 110 and 120 to form recesses in the sidewalls of the bottom and top nanosheet stack structures 110 and 120 that are not protected by the dielectric sidewalls 800-S. The exposed sidewall surfaces of the nanosheet channel layers 116 and 126 are laterally recessed to a pre-determined depth (e.g., in the x-direction). The amount of lateral recess may be controlled through a timed etch or through the selection of an etch chemistry that is selective to the bottom and top source/drain regions 1000 and 1102. In one embodiment, the depth of the recess is substantially equal to the thickness of the dielectric sidewalls 800-S and extends to the bottom and top source/drain regions 1000 and 1102 adjacent to gate structure 600-2.

In one illustrative embodiment, the lateral etch process can be performed using an isotropic wet etch process with an etch solution that is suitable to etch the semiconductor material (e.g., Si) of the nanosheet channel layers 116 and 126 selective to, dielectric sidewalls 800-S, first dielectric interlayer 800-1, second dielectric interlayer 800-2, inner spacers 900, ILD 1200, etch mask 1300 and any other exposed elements. In another embodiment, an isotropic dry plasma etch process can be performed to laterally etch the exposed sidewall surfaces of the nanosheet channel layers 116 and 126 selective to dielectric sidewalls 800-S, first dielectric interlayer 800-1, second dielectric interlayer 800-2, inner spacers 900, ILD 1200, etch mask 1300 and any other exposed elements.

The recesses are then filled with dielectric material to form the inner spacers 1400 (or embedded spacers) on the sidewalls of the bottom and top nanosheet stack structure 110 and 120. In one embodiment, the inner spacers 1400 are formed by depositing a conformal layer of dielectric material over the semiconductor device structure until the recesses are filled with dielectric material, followed by an etch back to remove the excess dielectric material. In one embodiment, the inner spacers 1400 are formed of the same dielectric material used to form the dielectric sidewalls 800-S and inner spacers 900. For example, the inner spacers 1400 can be formed of SiN, SiBCN, SiCON, or any other type of dielectric material (e.g., a low-k dielectric material having a k of less than 5) which is commonly used to form insulating nanosheet sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the bottom and top nanosheet stack structures 110 and 120 and expose the inner spacers 900 while leaving the dielectric material in the recesses to form the inner spacers 1400. The wet etch process may include, but is not limited to, hot phosphorous, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), or any combination thereof.

FIGS. 15A-15C are schematic views of a semiconductor structure 100 at an intermediate stage of fabrication after an etching of the semiconductor substrate 102 under gate structure 600-2 and the formation of an embedded capacitor structure in the semiconductor substrate 102. FIG. 15C is a top-down view (X-Y plane) of the semiconductor structure 100, FIG. 15A is a schematic cross-sectional side view (Y-Z plane) of the semiconductor structure 100 along section line A-A and FIG. 15B is a schematic cross-sectional side view (X-Z plane) of the semiconductor structure 100 along section line B-B.

A directional etch process, e.g., a directional RIE process, is utilized to etch through the second dielectric interlayer 800-2 in the capacitor opening region 1302 to expose the semiconductor substrate 102. For example, the directional RIE process may utilize an etch chemistry that is selective to the material of the semiconductor substrate 102, ILD 1200 and etch mask 1300. In other embodiments, the directional etch process may be a timed process where, for example, a portion of the semiconductor substrate 102 may be etched away along with the second dielectric interlayer 800-2 in the capacitor opening region 1302. In some embodiments, the capacitor opening region 1302 may be extended down into the semiconductor substrate 102 by the same etch process that removes the second dielectric interlayer 800-2 or by an additional directional etch process.

A further lateral etch process is utilized to laterally hollow out a cavity in the semiconductor substrate 102 for the formation of a capacitor structure comprising a dielectric liner 1500 and a storage node 1502. In one illustrative embodiment, the lateral etch process can be performed using an isotropic wet etch process with an etch solution that is suitable to etch the semiconductor material (e.g., Si) of the semiconductor substrate selective to the dielectric sidewalls 800-S, first dielectric interlayer 800-1, second dielectric interlayer 800-2, inner spacers 900, ILD 1200, etch mask 1300, inner spacers 1400 and any other exposed elements. In another embodiment, an isotropic dry plasma etch process can be performed to laterally etch the exposed semiconductor substrate 102 selective to the dielectric sidewalls 800-S, first dielectric interlayer 800-1, second dielectric interlayer 800-2, inner spacers 900, ILD 1200, etch mask 1300, inner spacers 1400 and any other exposed elements. As seen in FIG. 15B, for example, the capacitor structure comprising dielectric liner 1500 and storage node 1502 extends laterally below the dielectric sidewalls 800-S, inner spacers 900 and inner spacers 1400 in the z-direction. In some embodiments, a portion of the capacitor structure may extend laterally beneath the bottom and top source/drain regions 1000 and 1102.

The dielectric liner 1500 is formed by depositing a dielectric material within the cavity on the exposed walls of the semiconductor substrate 102. In one embodiment, dielectric liner 1500 is formed by depositing a conformal layer of dielectric material over the semiconductor device structure. In one embodiment, the dielectric liner 1500 is formed of a dielectric material including but not limited to $SiO_x$, low temperature oxide (LTO), high temperature oxide (HTO), flowable oxide (FOX), high-k dielectric material or other dielectric materials.

For example, a high-k dielectric material used to form the dielectric liner 1500 can include but is not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. The conformal layer of dielectric material is deposited using known deposition techniques including, but not limited to, CVD, PECVD, RFCVD, PVD, ALD, MLD, MBD, PLD, LSMCD, sputtering, and/or plating, which allow for high conformality of the dielectric material.

Storage node 1502 is formed by depositing a metal-based material to fill in the capacitor cavity. The metal-based material includes a low resistance metal, such as, for example, doped poly, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The metal-based material of the storage node 1502 is deposited using, for example, deposition techniques including, but not limited to, CVD, PECVD, RFCVD, PVD, ALD, MLD, MBD, PLD, LSMCD, sputtering, and/or plating. In some embodiments, the storage node 1502 is deposited to overfill the cavity with excess filling into the capacitor opening region 1302 followed by CMP and an etch back process to etch away any unwanted metal-based material such that, for example, any metal-based material that extends from the capacitor cavity into the capacitor opening region 1302 between the bottom and top nanosheet stack structures 110 and 120 is etched away. After that, any exposed dielectric layer 1500 is also removed.

The embedded capacitor structure comprises the storage node 1502 as a first conductor, dielectric liner 1500 as the insulator, and the semiconductor substrate 102 as the second conductor.

FIGS. 16A-16C are schematic views of a semiconductor structure 100 at an intermediate stage of fabrication after the formation of a capacitor contact 1600 and dielectric cap 1602 over the embedded capacitor structure to fill in the capacitor opening region 1302. FIG. 16C is a top-down view (X-Y plane) of the semiconductor structure 100, FIG. 16A is a schematic cross-sectional side view (Y-Z plane) of the semiconductor structure 100 along section line A-A and FIG. 16B is a schematic cross-sectional side view (X-Z plane) of the semiconductor structure 100 along section line B-B.

Capacitor contact 1600 is formed by depositing a metal-based material on the storage node 1502 in the capacitor opening region 1302. The metal-based material includes a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. In some embodiments, the metal-based material of the storage node 1502 is different than the metal-based material of the capacitor contact 1600. In other embodiments, both the storage node 1502 and the capacitor contact 1600 may comprise the same metal-based material.

The metal-based material of the capacitor contact 1600 is deposited using, for example, deposition techniques including, but not limited to, CVD, PECVD, RFCVD, PVD, ALD, MLD, MBD, PLD, LSMCD, sputtering, and/or plating. In some embodiments, metal-based material of the capacitor contact 1600 is deposited to fill capacitor opening region 1302 and an anisotropic etch is utilized to etch away any unwanted metal-based material. In some embodiments, for example, the metal-based material of the capacitor contact 1600 may be etched back to a level that is between the first dielectric interlayer 800-1 and second dielectric interlayer 800-2 in the z-direction.

Dielectric cap 1602 is formed by depositing a conformal layer of dielectric material over the entire surface of the semiconductor device structure. The conformal layer of dielectric material can be formed of $SiO_2$, SiN, SiCN, SiON, BN, SiBN, SiBCN, SiOC, SiOCN, or any other type of dielectric material that is commonly used to form insulating spacers of FET devices, and deposited using known techniques such as atomic layer deposition (ALD), CVD and PVD. A CMP process is then performed to planarize the semiconductor device structure, including the etch mask 1300, gate capping layers 620-1 and 620-3, dielectric sidewalls 800-S, ILD 1200 and dielectric cap 1602 to expose the dummy gate electrodes 610-1 and 610-2, for example, as shown in FIG. 16B.

Figure 17C:
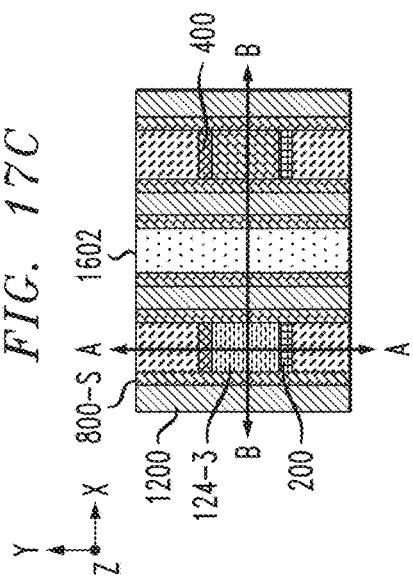
FIGS. 17A-17C are schematic views of the semiconductor structure of FIGS. 16A-16C after the removal of the dummy gate electrode to open an open gate region in the first gate structure that exposes the bottom and top nanosheet stack structures and the bottom and top nanosheet sidewall spacers of the first gate structure and after the removal of the dummy gate electrode of the third gate structure to open an open gate region in the third gate structure that exposes the first dielectric interlayer of the third gate structure, according to an illustrative embodiment.
Figure 17B:
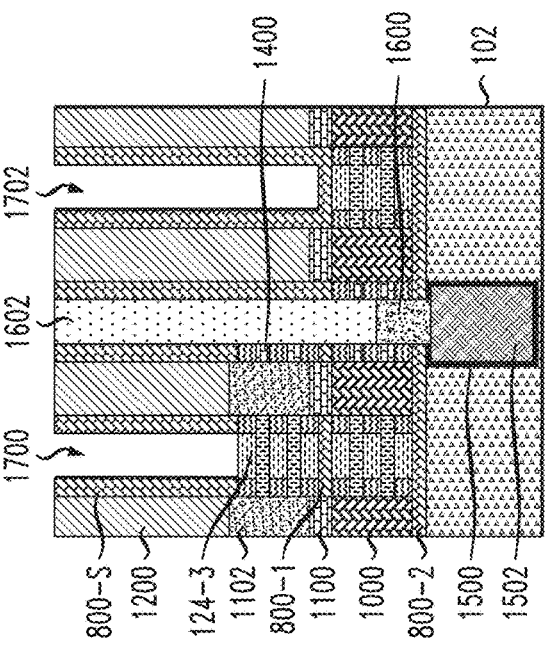
Figure 17A:
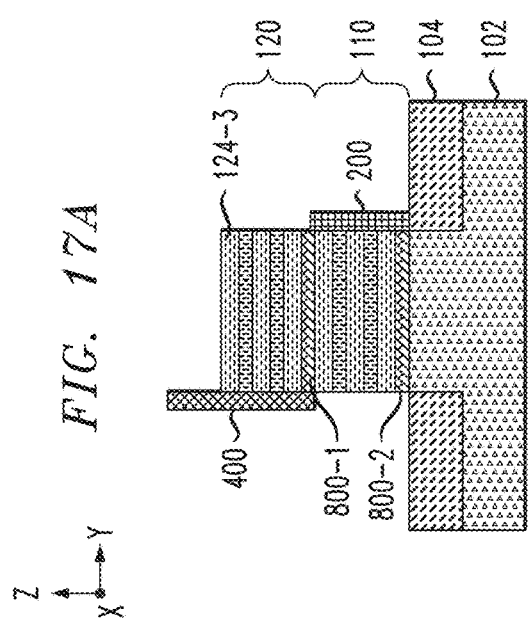

FIGS. 17A-17C are schematic views of a semiconductor structure 100 at an intermediate stage of fabrication after the removal of the dummy gate electrode 610-1 to open an open gate region 1700 in gate structure 600-1 that exposes the bottom and top nanosheet stack structures 110 and 120 and the bottom and top nanosheet sidewall spacers 200 and 400 of gate structure 600-1 and after the removal of the dummy gate electrode 610-3 to open an open gate region 1702 in gate structure 600-3 that exposes the first dielectric interlayer 800-1 of gate structure 600-3. FIG. 17C is a top-down view (X-Y plane) of the semiconductor structure 100, FIG. 17A is a schematic cross-sectional side view (Y-Z plane) of the semiconductor structure 100 along section line A-A and FIG. 17B is a schematic cross-sectional side view (X-Z plane) of the semiconductor structure 100 along section line B-B.

The dummy gate electrodes 610-1 and 610-3 are etched away using known etching techniques and etch chemistries. For example, the dummy gate material can be removed using a selective dry etch or wet etch process with suitable etch chemistries, including ammonium hydroxide ($NH_4OH$), tetramethylammonium hydroxide (TMAH), or SF6 plasma. The etching of the dummy gate electrodes 610-1 and 610-3 is selective to, e.g., a thin dummy gate oxide liner (not shown), to thereby protect the semiconductor materials of the bottom and top nanosheet stack structures 110 and 120 from being etched during the poly etch process, followed by removal of the dummy gate oxide liner, by process such as a DHF wet clean. The etching of the dummy gate electrodes 610-1 and 610-3 is also selective to the dielectric sidewalls 800-S, first dielectric interlayer 800-1 and ILD 1200.

Figure 18C:
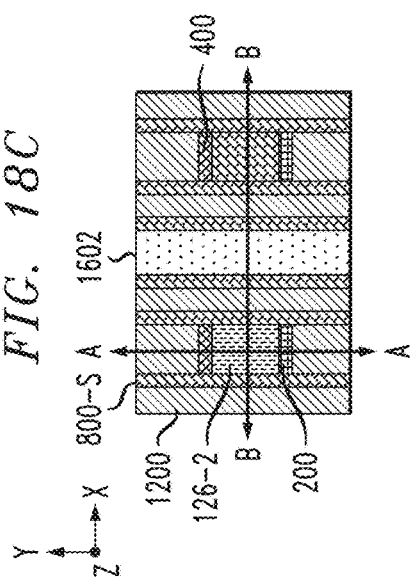
FIGS. 18A-18C are schematic views of the semiconductor structure of FIGS. 17A-17C after the removal of the sacrificial nanosheet layers, according to an illustrative embodiment.
Figure 18B:
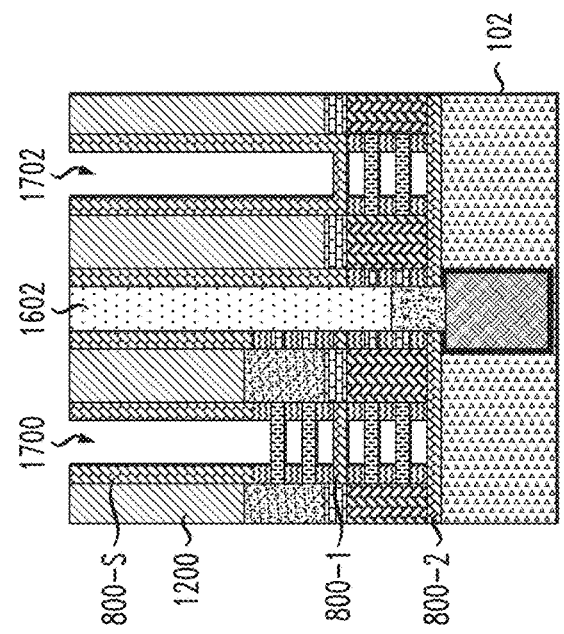
Figure 18A:
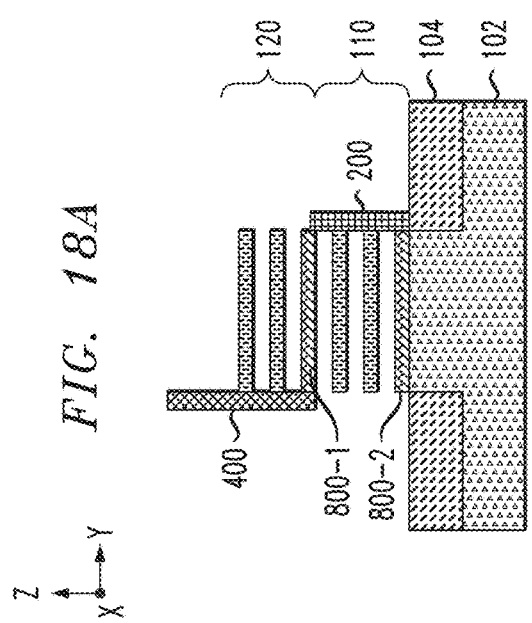

FIGS. 18A-18C are schematic views of a semiconductor structure 100 at an intermediate stage of fabrication after the removal of the sacrificial nanosheet layers 114 and 124. FIG. 18C is a top-down view (X-Y plane) of the semiconductor structure 100, FIG. 18A is a schematic cross-sectional side view (Y-Z plane) of the semiconductor structure 100 along section line A-A and FIG. 18B is a schematic cross-sectional side view (X-Z plane) of the semiconductor structure 100 along section line B-B.

The etch process is performed to selectively etch away the sacrificial nanosheet layers 114 and 124 of the bottom and top nanosheet stack structures 110 and 120 to release the nanosheet channel layers 116 and 126, thereby allowing the open gate regions 1700 and 1702 to extend into spaces between and adjacent to the nanosheet channel layers 116 and 126. In this embodiment, the open gate regions 1700 and 1702 includes the open spaces within the inner region defined by the dielectric sidewalls 800-S and the inner spacers 900.

The sacrificial nanosheet layers 114 and 124, e.g., SiGe layers, can be etched away selective to the nanosheet channel layers 116 and 126, e.g., Si layers, using a wet etch process, for example. In one embodiment, the SiGe material of the sacrificial nanosheet layers 114 and 124 can be selectively etched (with high etch selectivity) using a gas phase HCl (hydrochloric acid) or wet etch solution to laterally etch the SiGe material of the sacrificial nanosheet layers 114 and 124 selective to the Si material of the nanosheet channel layers 116 and 126. The gas phase HCl (hydrochloric acid) provides high etch selectivity when, for example, the nanosheet channel layers 116 and 126 are formed of Si or SiGe with a lower Ge concentration than the SiGe material of the sacrificial nanosheet layers 114 and 124.

Figure 19C:
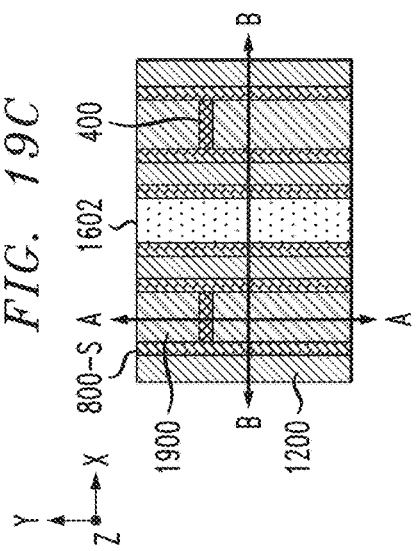
FIGS. 19A-19C are schematic views of the semiconductor structure of FIGS. 18A-18C after the formation of a gate stack layer, according to an illustrative embodiment.
Figure 19B:
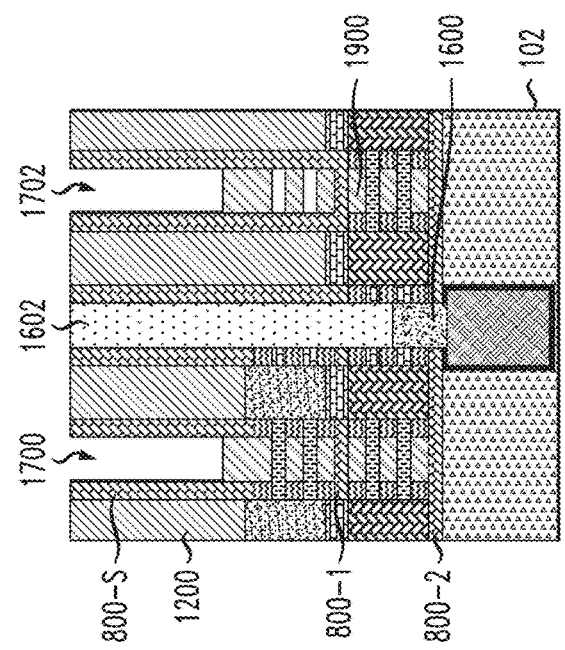
Figure 19A:
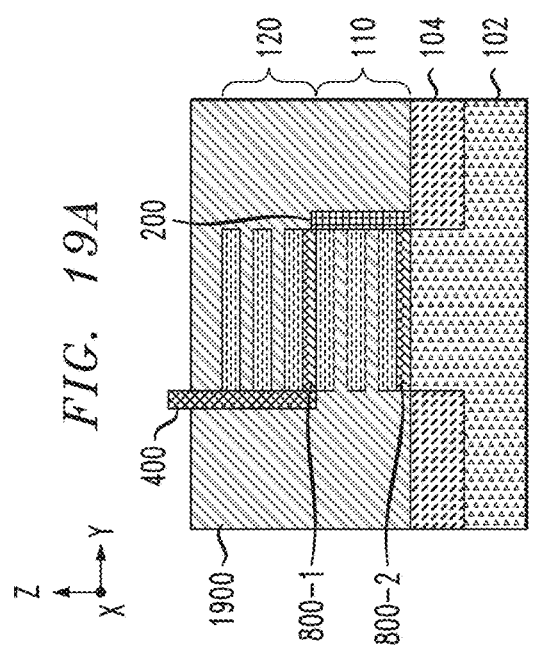

FIGS. 19A-19C are schematic views of a semiconductor structure 100 at an intermediate stage of fabrication after the formation of a gate stack layer 1900. FIG. 19C is a top-down view (X-Y plane) of the semiconductor structure 100, FIG. 19A is a schematic cross-sectional side view (Y-Z plane) of the semiconductor structure 100 along section line A-A and FIG. 19B is a schematic cross-sectional side view (X-Z plane) of the semiconductor structure 100 along section line B-B.

The gate stack layer 1900 may include a metal gate or work function metal (WFM). In an illustrative embodiment, gate stack layer 1900 comprises a WFM for either an nFET device or a pFET device. For nFET devices, the WFM for the gate stack may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate stack may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate stack layer 1900 as desired. In some embodiments, a gate dielectric layer may be disposed or formed under the gate stack layer 1900 and may comprise a dielectric material such as, e.g., SiO2, SiON, high-k dielectric or other dielectric materials.

The gate stack layer 1900 is formed using, for example, deposition techniques including, but not limited to, CVD, PECVD, RFCVD, PVD, ALD, MLD, MBD, PLD, LSMCD, sputtering, and/or plating. In an illustrative embodiment, gate stack layer 1900 is deposited on the semiconductor device structure including on STI layer 104, on and in between the nanosheet channel layers 116 of the bottom and top nanosheet stack structures 110 and 120 and on the bottom and top nanosheet sidewall spacers 200 and 400, for example, as seen in FIGS. 19A and 19B. The WFM material may be recessed using, for example, etching processes.

Figure 20A:
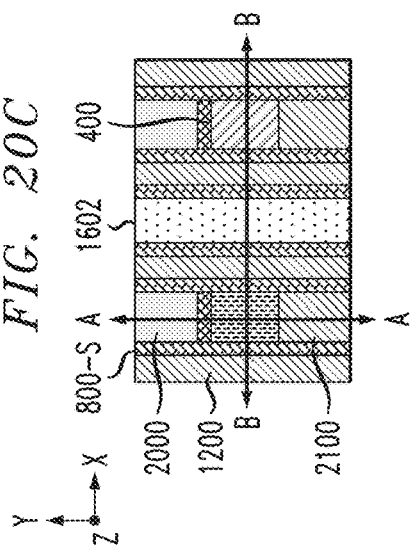
FIGS. 20A-20C are schematic views of the semiconductor structure of FIGS. 19A-19C after the formation and patterning of an etch mask over the gate stack layer and the removal of the gate stack layer from the top nanosheet stack structure, according to an illustrative embodiment.
Figure 20B:
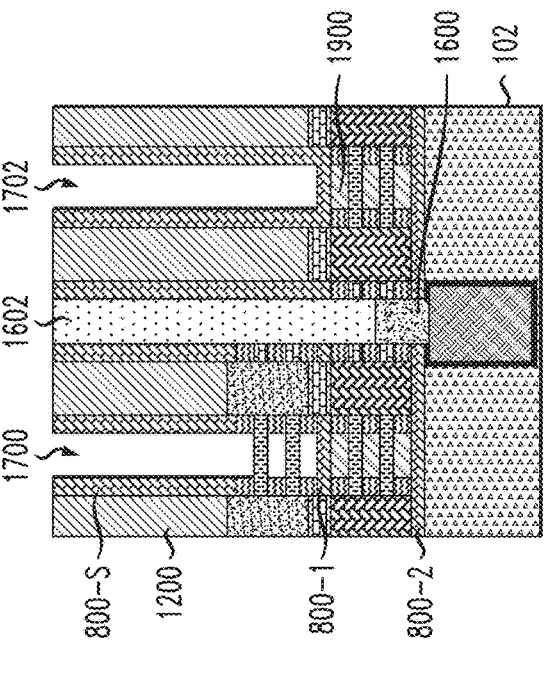
Figure 20C:
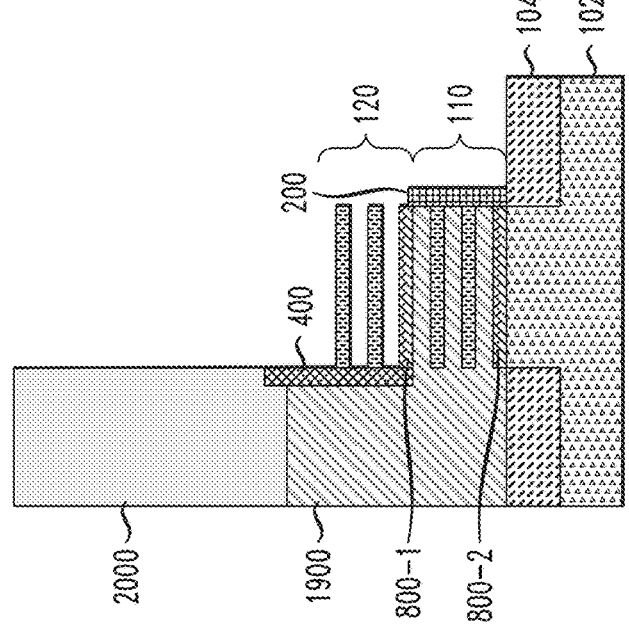

FIGS. 20A-20C are schematic views of a semiconductor structure 100 at an intermediate stage of fabrication after the formation and patterning of an etch mask 2000 over the gate stack layer 1900 and the removal of the gate stack layer 1900 from the top nanosheet stack structure 120. FIG. 20C is a top-down view (X-Y plane) of the semiconductor structure 100, FIG. 20A is a schematic cross-sectional side view (Y-Z plane) of the semiconductor structure 100 along section line A-A and FIG. 20B is a schematic cross-sectional side view (X-Z plane) of the semiconductor structure 100 along section line B-B.

In an illustrative embodiment, a lithographic process is utilized to form etch mask 2000 over a portion of the semiconductor structure 100 including gate stack layer 1900. For example, an OPL may be coated on the semiconductor structure 100, followed by a lithographic process to pattern the OPL and form the etch mask 2000. The OPL may comprise, for example, a resin material that is applied by spin coating and baked to enhance planarization. The patterned portion of the OPL is removed such that etch mask 2000 masks access to the bottom nanosheet stack structure 110 and adjacent regions, e.g., to the left of the top nanosheet sidewall spacer 400 as seen in FIG. 20A, while exposing the top nanosheet stack structure 120 and adjacent regions, e.g., to the right of the top nanosheet sidewall spacer 400 and to the right of bottom nanosheet sidewall spacer 200. An etch process is utilized to etch away the WFM material and expose the nanosheet channel layers 126 of the top nanosheet stack structure 120 and the STI layer 104, for example, as seen in FIG. 20A. For example, the etch chemistry may be selective to the material of the STI layer 104, nanosheet channel layers 126, bottom nanosheet sidewall spacer 200, top nanosheet sidewall spacers 400, first dielectric interlayer 800-1 and etch mask 2000.

Figure 21C:
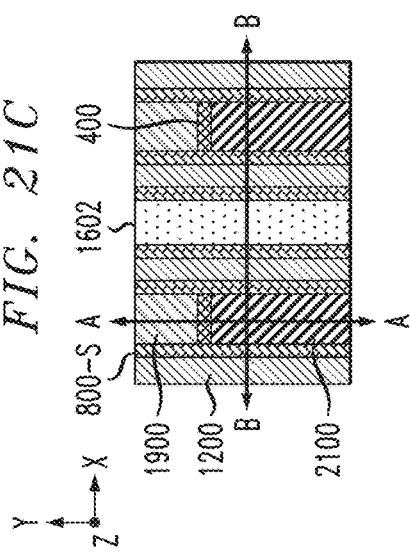
FIGS. 21A-21C are schematic views of the semiconductor structure of FIGS. 20A-20C after the formation of a gate stack layer and removal of etch mask, according to an illustrative embodiment.
Figure 21B:
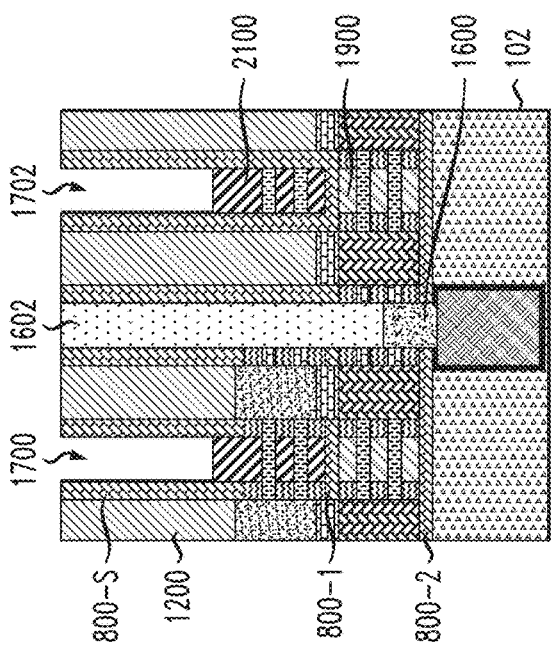
Figure 21A:
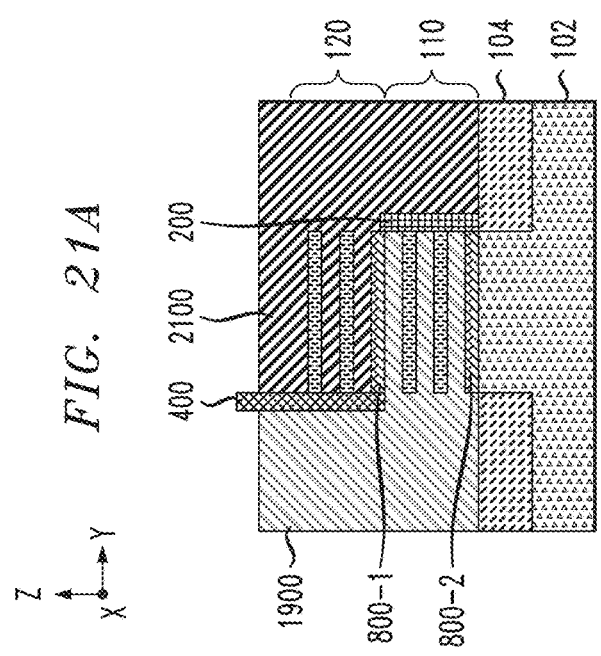

FIGS. 21A-21C are schematic views of a semiconductor structure 100 at an intermediate stage of fabrication after the formation of a gate stack layer 2100 and removal of etch mask 2000. FIG. 21C is a top-down view (X-Y plane) of the semiconductor structure 100, FIG. 21A is a schematic cross-sectional side view (Y-Z plane) of the semiconductor structure 100 along section line A-A and FIG. 21B is a schematic cross-sectional side view (X-Z plane) of the semiconductor structure 100 along section line B-B.

The gate stack layer 2100 may include a metal gate or work function metal (WFM). In an illustrative embodiment, gate stack layer 2100 comprises a WFM for either an nFET device or a pFET device, where gate stack layer 1900 and gate stack layer 2100 comprise WFM that are for different devices. For example, if the gate stack layer 1900 comprises WFM for an nFET device, gate stack layer 2100 will comprise WFM for a pFET device, and vice versa. For nFET devices, the WFM for the gate stack may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate stack may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate stack layer 1900 as desired.

The gate stack layer 2100 is formed using, for example, deposition techniques including, but not limited to, CVD, PECVD, RFCVD, PVD, ALD, MLD, MBD, PLD, LSMCD, sputtering, and/or plating. In an illustrative embodiment, gate stack layer 2100 is deposited on the semiconductor device structure including on STI layer 104, on and in between the nanosheet channel layers 126 of the top nanosheet stack structure 120, and on the bottom and top nanosheet sidewall spacers 200 and 400, for example, as seen in FIG. 21B. WFM material may be recessed using, for example, etching or CMP processes.

FIGS. 22A-22C are schematic views of a semiconductor structure 100 at an intermediate stage of fabrication after the formation of a capping layer 2200, additional ILD 1200 and an etch mask 2202 on the gate stack layers 1900 and 2100. FIG. 22C is a top-down view (X-Y plane) of the semiconductor structure 100, FIG. 22A is a schematic cross-sectional side view (Y-Z plane) of the semiconductor structure 100 along section line A-A and FIG. 22B is a schematic cross-sectional side view (X-Z plane) of the semiconductor structure 100 along section line B-B.

Capping layer 2200 is formed on the gate stack layers 1900 and 2100 in the open gate regions 1700 and 1702. The capping layer 2200 includes, for example, SiN, SiBN, SiBCN, SiOCN or other dielectric materials. The capping layer 2200 may be conformally deposited using, for example, deposition techniques including, but not limited to, CVD, PECVD, RFCVD, PVD, ALD, MLD, MBD, PLD, LSMCD, sputtering, and/or plating. Excess dielectric material from the formation of the capping layer 2200 may be removed using, for example, etching or CMP processes, to planarize the capping layer 2200 to expose the upper surfaces of the dielectric sidewalls 800-S.

Additional material is added to the ILD 1200 to cover over the capping layer 2200, dielectric sidewalls 800-S and dielectric cap 1602. For example, a dielectric material, including, but not limited to $SiO_x$, low temperature oxide (LTO), high temperature oxide (HTO), flowable oxide (FOX) or some other dielectric, is deposited to extend the ILD 1200 over the capping layer 2200, dielectric sidewalls 800-S and dielectric cap 1602. The additional material for extending the ILD 1200 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD 1200 and planarize the resulting structure.

A lithographic process is utilized to form etch mask 2202 over the semiconductor structure 100 including the ILD 1200. For example, an OPL may be coated on the semiconductor structure 100, followed by a lithographic process to pattern the OPL and form the etch mask 2202. The OPL may comprise, for example, a resin material that is applied by spin coating and baked to enhance planarization. The patterned portion of the OPL is removed such that a contact opening 2204 in the etch mask 2202 exposes the ILD 1200 above the dielectric cap 1602, capacitor contact 1600 and storage node 1502 of the capacitor structure, as seen in FIG. 22B. As can be seen in FIG. 22B, the contact opening 2204 is also above one of the dielectric sidewalls 800-S.

FIGS. 23A-23C are schematic views of a semiconductor structure 100 at an intermediate stage of fabrication after etching is performed to extend the contact opening 2204 down to the dielectric cap 1602. FIG. 23C is a top-down view (X-Y plane) of the semiconductor structure 100, FIG. 23A is a schematic cross-sectional side view (Y-Z plane) of the semiconductor structure 100 along section line A-A and FIG. 23B is a schematic cross-sectional side view (X-Z plane) of the semiconductor structure 100 along section line B-B.

An etch process is utilized to extend the contact opening 2204 and expose the capacitor contact 1600 and adjacent inner spacer 1400. For example, a directional etch such as, e.g., an RIE process, may be utilized to etch away dielectric cap 1602 and dielectric sidewalls 800-S under the contact opening 2204 and expose the capacitor contact 1600 and adjacent inner spacer 1400.

FIGS. 24A-24C are schematic views of a semiconductor structure 100 at an intermediate stage of fabrication after forming an etch mask 2400, patterning the etch mask 2400 and etching according to the patterning to form gate contact openings 2402 and 2404 that expose the gate stack layers 1900 and 2100. FIG. 24C is a top-down view (X-Y plane) of the semiconductor structure 100, FIG. 24A is a schematic cross-sectional side view (Y-Z plane) of the semiconductor structure 100 along section line A-A and FIG. 24B is a schematic cross-sectional side view (X-Z plane) of the semiconductor structure 100 along section line B-B.

A lithographic process is utilized to form etch mask 2400. In some embodiments, the etch mask 2400 may be formed by adding additional OPL material over etch mask 2202. In some embodiments, etch mask 2202 may be removed and a new layer of OPL material may be coated over the semiconductor structure 100 including in contact opening 2204. For example, an OPL may be coated on the semiconductor structure 100 to fill in the contact opening 2204, followed by a lithographic process to pattern the OPL and form the etch mask 2400. The OPL may comprise, for example, a resin material that is applied by spin coating and baked to enhance planarization. The patterned portion of the OPL is removed such that gate contact openings 2402 and 2404 are formed in the etch mask 2400 and the pattern is etched down into the ILD 1200 and capping layer 2200 such that the gate contact openings 2402 and 2404 extend to expose the gate stack layers 1900 and 2100, as seen in FIG. 24A. In illustrative embodiments, the etch process, e.g., a directional RIE process, is selective to the WFM materials of the gate stack layers 1900 and 2100.

Figure 25C:
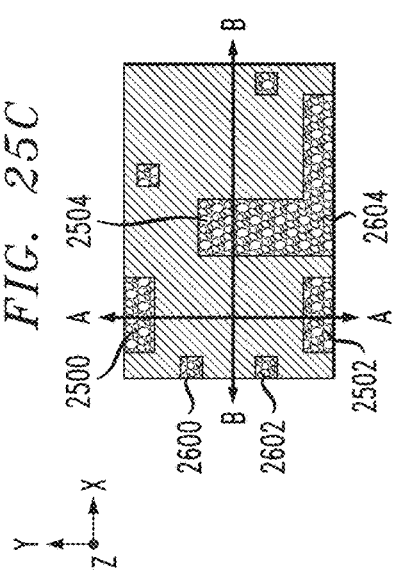
Figure 25B:
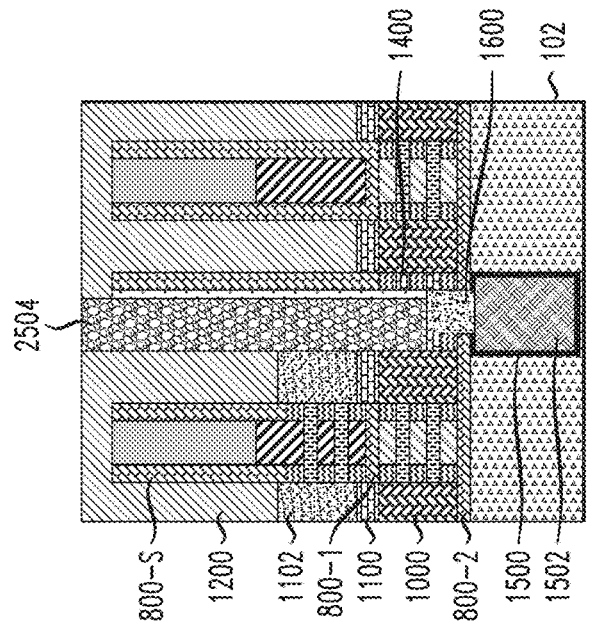
Figure 25A:
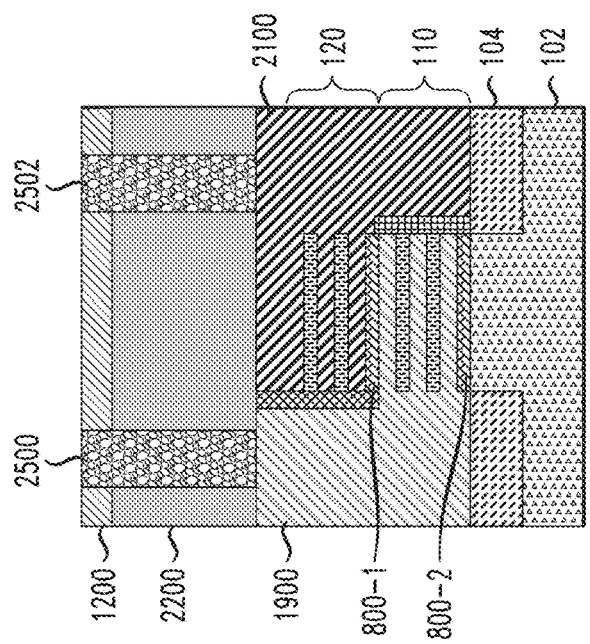

FIGS. 25A-25C, 26A-26C, 27A and 27B are schematic views of a semiconductor structure 100 at an intermediate stage of fabrication after removal of the etch mask 2400 and the formation of gate contacts 2500, 2502, capacitor contact 2504, source/drain contact 2600, 2602 and gate/capacitor cross couple contact 2604. FIGS. 25C, 26C and 27B are top-down views (X-Y plane) of the semiconductor structure 100, FIG. 25A is a schematic cross-sectional side view (Y-Z plane) of the semiconductor structure 100 along section line A-A of FIG. 25C and FIG. 25B is a schematic cross-sectional side view (X-Z plane) of the semiconductor structure 100 along section line B-B of FIG. 25C. FIG. 26A is a schematic cross-sectional side view (Y-Z plane) of the semiconductor structure 100 along section line A'-A' of FIG. 26C and FIG. 26B is a schematic cross-sectional side view (X-Z plane) of the semiconductor structure 100 along section line B'-B' of FIG. 26C. FIG. 27A is a schematic cross-sectional side view (Y-Z plane) of the semiconductor structure 100 along section line A"-A" of FIG. 27B.

Etch mask 2400 may be removed, for example, by an etching process that is selective to the materials of ILD 1200, gate stack layers 1900 and 2100 and inner spacers 1400, such as N2/H2 ash.

Additional S/D contacts, gate/capacitor cross couple contacts are patterned by separate lithographic patterning and etch processes. Contact metals are formed in the contact openings by filling the contact openings with a contact material, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed in the contact bottom and sidewall surface before low resistance metal fills. Deposition of the contact material 2500, 2502, 2504, 2600, 2602 and 2604 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

As can be seen in FIGS. 25A-25C and 27A, contact material 2500 forms a connection to gate stack layer 1900, contact material 2502 forms a connection to gate stack layer 2100 and contact material 2504 forms a connection to capacitor contact 1600 and to the bottom and top source/drain regions 1000 and 1102 of the gate structure 600-1. Note that since bottom source/drain region 1000 and top source/drain region 1102 are formed of different FET material, e.g., one comprises a pFET material and the other comprises an nFET material, the storage node 1502 is connected to both an nFET source/drain region and a pFET source drain region via the contact material 2504 and capacitor contact 1600. As also seen in FIG. 27A, the capacitor contact 1600 is wider than the storage node 1502 in the y-direction, e.g., as wide as the gate structures 600 in the y-direction in some embodiments.

As can be seen in FIGS. 26A-26C, contact material 2600 forms a connection to the bottom source/drain region 1000, contact material 2602 forms a connection to the top source/ drain region 1102 and contact material 2604 forms a connection between gate and capacitor contact 1600.

Thereafter, any known sequence of processing steps can be performed to complete the fabrication of the semiconductor structure, the details of which are not needed to understand the illustrative embodiments. Briefly, by way of example, middle-of-the-line (MOL) processing can continue to form MOL contacts (e.g., gate contacts, source/drain contacts, etc.). Then, a back-end-of-line (BEOL) process module can be performed to fabricate a BEOL interconnect structure which provides connections to/between the MOL contacts, and other active or passive devices that are formed as part of the front-end-of-line (FEOL) layer.

It is to be understood that the methods discussed herein for fabricating nanosheet FET devices with embedded capacitors can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings illustrative embodiments provided herein, one of ordinary skill in the art will be able to contemplate other implementations and applications of the techniques of the illustrative embodiments.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

The invention claimed is:

1. A semiconductor structure, comprising:
a substrate having a first region, a second region, and a third region;
a capacitor structure disposed in the second region of the substrate, the capacitor structure comprising a capacitor conductor and a dielectric insulator disposed between the capacitor conductor and the substrate;
a stacked device disposed on the first region of the substrate, the stacked device comprising a first transistor and a second transistor in a stacked configuration disposed on the first region of the substrate, the first transistor and the second transistor each being coupled to the capacitor conductor; and
a non-stacked device-disposed on the third region, the non-stacked device comprising a third transistor disposed on the third region and having a gate stack disposed on a top surface thereof and being coupled to the capacitor conductor.

2. The semiconductor structure of claim 1, wherein the first transistor and the second transistor each being coupled to the capacitor conductor comprises a source/drain region of the first transistor and a source/drain region of the second transistor each being coupled to the capacitor conductor.

3. The semiconductor structure of claim 2, wherein the source/drain region of the first transistor comprises one of a n-type field effect transistor material and a p-type field effect transistor material and the source/drain region of the second transistor comprises the other of the n-type field effect transistor material and the p-type field effect transistor material.

4. The semiconductor structure of claim 1, wherein the stacked device comprises a stacked nanosheet device, the first transistor comprising a first nanosheet stack structure of the stacked nanosheet device and the second transistor comprising a second nanosheet stack structure of the stacked nanosheet device, the second nanosheet stack structure being disposed under the first nanosheet stack structure.

5. The semiconductor structure of claim 1, wherein:
a gate stack of the first transistor comprises a first work function metal;
a gate stack of the second transistor comprises a second work function metal that is different than the first work function metal; and
the gate stack of the third transistor comprises one of the first work function metal and the second work function metal.

6. The semiconductor structure of claim 5, wherein the gate stack of the third transistor comprises the second work function metal.

7. The semiconductor structure of claim 1, wherein the stacked device extends from the substrate in a first direction, the at least a portion of the second transistor being disposed below the at least a portion of the first transistor in the first direction.

8. The semiconductor structure of claim 7, wherein:
the second region comprises a capacitor contact disposed above the capacitor conductor in the first direction; and
the capacitor contact is wider than the capacitor conductor in a second direction that is perpendicular to the first direction.

9. A semiconductor device, comprising:
a nanosheet field-effect transistor device disposed on a semiconductor substrate, wherein the nanosheet field-effect transistor device comprises:
a stacked transistor structure comprising:
a first transistor comprising a first nanosheet stack structure disposed on a first region of the semiconductor substrate; and
a second transistor comprising a second nanosheet stack structure disposed on the first nanosheet stack structure;
a capacitor structure disposed in a second region of the semiconductor substrate; and
a third transistor adjacent the stacked transistor structure, the third transistor comprising a third nanosheet stack structure disposed on a third region of the semiconductor substrate and having a gate stack disposed on a top surface thereof;
wherein the first, second, and third nanosheet stack structures are coupled to the capacitor structure.

10. The semiconductor device of claim 9, wherein a source/drain region of the first transistor and a source/drain region of the second transistor are coupled to a capacitor conductor of the capacitor structure.

11. The semiconductor device of claim 10, wherein the source/drain region of the first transistor comprises one of a n-type field effect transistor material and a p-type field effect transistor material and the source/drain region of the second transistor comprises the other of the n-type field effect transistor material and the p-type field effect transistor material.

12. The semiconductor device of claim 9, wherein:
a gate stack of the first transistor comprises a first work function metal;
a gate stack of the second transistor comprises a second work function metal that is different than the first work function metal; and
the gate stack of the third transistor comprises one of the first work function metal and the second work function metal.

13. The semiconductor device of claim 12, wherein the gate stack of the third transistor comprises the first work function metal.

14. The semiconductor device of claim 12, wherein the gate stack of the third transistor is coupled to a capacitor conductor of the capacitor structure.

15. The semiconductor device of claim 9, wherein the first nanosheet stack structure extends from the semiconductor substrate in a first direction and the second nanosheet stack structure extends from the first nanosheet stack structure in the first direction.

16. The semiconductor device of claim 15, wherein:
the second region comprises a capacitor contact disposed above a capacitor conductor of the capacitor structure in the first direction; and
the capacitor contact is wider than the capacitor conductor in a second direction that is perpendicular to the first direction.

17. The semiconductor structure of claim 1, wherein the second region is disposed between the first region and the third region.

18. The semiconductor device of claim 9, wherein the second region is disposed between the first region and the third region.

* * * * *